(12) United States Patent
Chung et al.

(10) Patent No.: US 11,818,839 B2
(45) Date of Patent: *Nov. 14, 2023

(54) DISPLAY PANEL AND DISPLAY DEVICE INCLUDING THE SAME HAVING PADS WITH INCLINATIONS WITH RESPECT TO REFERENCE LINES

(71) Applicant: Samsung Display Co., Ltd., Yongin-si (KR)

(72) Inventors: Yun-mo Chung, Yongin-si (KR); Tak-young Lee, Anyang-si (KR); Joosun Yoon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 64 days.

This patent is subject to a terminal disclaimer.

(21) Appl. No.: 17/124,383

(22) Filed: Dec. 16, 2020

(65) Prior Publication Data

US 2021/0105896 A1    Apr. 8, 2021

Related U.S. Application Data

(63) Continuation of application No. 16/401,070, filed on May 1, 2019, now Pat. No. 10,880,999.

(30) Foreign Application Priority Data

May 15, 2018    (KR) .................. 10-2018-0055254

(51) Int. Cl.
  *H05K 1/11*    (2006.01)
  *H05K 5/00*    (2006.01)
  *H10K 59/131*  (2023.01)

(52) U.S. Cl.
  CPC .......... *H05K 1/111* (2013.01); *H05K 5/0017* (2013.01); *H10K 59/131* (2023.02);
  (Continued)

(58) Field of Classification Search
  CPC ......... H05K 1/111; H05K 2201/09418; H05K 2201/094; H05K 2201/10128;
  (Continued)

(56) References Cited

U.S. PATENT DOCUMENTS

6,300,997 B1    10/2001  Saito et al.
7,132,735 B2 *  11/2006  Diberardino ............ H01L 24/49
                                                257/784

(Continued)

FOREIGN PATENT DOCUMENTS

CN    104123902    10/2014
CN    104201167    12/2014

(Continued)

OTHER PUBLICATIONS

Extended European Search Report issued in European U.S. Appl. No. 19/173,508 (dated Oct. 14, 2019).

(Continued)

*Primary Examiner* — James Wu
(74) *Attorney, Agent, or Firm* — H.C. Park & Associates, PLC

(57) ABSTRACT

A display panel includes: a display substrate having a display area, and a pad area disposed on at least one side of thereof; and a plurality of pad groups arranged on the pad area in a first direction and including: a first pad group having a plurality of first pads, at least some of the plurality of first pads have a first inclination with respect to a reference line extending in a second direction different from the first direction, and the plurality of first pads being spaced from each other at a first pitch; and a second pad group having a plurality of second pads, at least some of the plurality of second pads having a different second inclina- (Continued)

tion with respect to the reference line, and the plurality of second pads being spaced from each other at a second pitch different from the first pitch.

15 Claims, 15 Drawing Sheets

(52) U.S. Cl.
CPC .............. *H01L 2224/49171* (2013.01); *H05K 2201/094* (2013.01); *H05K 2201/09418* (2013.01)

(58) Field of Classification Search
CPC .............. G02F 1/13458; H01L 27/3276; H01L 2224/49171; H01L 2224/49177
See application file for complete search history.

(56) References Cited

U.S. PATENT DOCUMENTS

| | | | |
|---|---|---|---|
| 8,299,631 B2* | 10/2012 | Horiguchi | G02F 1/13452 |
| | | | 257/E23.021 |
| 9,257,763 B2* | 2/2016 | Finkman | H05K 1/117 |
| 9,761,560 B2 | 9/2017 | Lee et al. | |
| 9,999,133 B2* | 6/2018 | Cho | H05K 1/118 |
| 10,373,987 B2 | 8/2019 | Lee | |
| 10,665,151 B2* | 5/2020 | Zhang | G09G 3/2096 |
| 2011/0122172 A1 | 5/2011 | Tanigawa et al. | |
| 2011/0193239 A1 | 8/2011 | Horiguchi et al. | |
| 2012/0134120 A1* | 5/2012 | Gondo | G02F 1/13452 |
| | | | 174/250 |
| 2010/4321088 | 10/2014 | Bae et al. | |
| 2014/0321088 A1 | 10/2014 | Bae et al. | |
| 2015/0103500 A1* | 4/2015 | Bae | H05K 1/111 |
| | | | 228/102 |
| 2015/0366049 A1* | 12/2015 | Lee | H01L 24/05 |
| | | | 361/767 |
| 2016/0104692 A1 | 4/2016 | Lee et al. | |
| 2017/0127512 A1* | 5/2017 | Park | H05K 1/0271 |
| 2018/0053790 A1 | 2/2018 | Kwon et al. | |
| 2018/0090442 A1 | 5/2018 | Li et al. | |

FOREIGN PATENT DOCUMENTS

| | | |
|---|---|---|
| CN | 105301851 | 2/2016 |
| CN | 106652786 | 5/2017 |
| EP | 2957951 | 12/2015 |
| JP | 2015204458 | 11/2015 |
| KR | 10-2015-0054454 | 5/2015 |
| KR | 10-1551532 | 9/2015 |
| KR | 10-2016-0043571 | 4/2016 |
| WO | 2018077257 | 5/2018 |

OTHER PUBLICATIONS

Non-Final Office Action dated Apr. 22, 2020, in U.S. Appl. No. 16/401,070.
Notice of Allowance dated Aug. 25, 2020, in U.S. Appl. No. 16/401,070.

* cited by examiner

DISPLAY PANEL AND DISPLAY DEVICE INCLUDING THE SAME HAVING PADS WITH INCLINATIONS WITH RESPECT TO REFERENCE LINES

CROSS-REFERENCE TO RELATED APPLICATION

This application is a Continuation of U.S. patent application Ser. No. 16/401,070, filed on May 1, 2019, and claims priority from and the benefit of Korean Patent Application No. 10-2018-0055254, filed on May 15, 2018, which is hereby incorporated by reference for all purposes as if fully set forth herein.

BACKGROUND

Field

Exemplary implementations of the invention relate generally to a display panel and a display device including the same and, more particularly, to a display panel having a reduced dead space area outside the display area, and a display device including the same.

Discussion of the Background

Various types of display devices are being used to provide image information. Such display devices include a display area on which an image is displayed, and panel pads disposed outside the display area for providing a driving signal to a display part that displays an image.

To arrange the panel pads and connection lines connecting the panel pads to the display part, space is required at the periphery of the display area. Minimizing the area on which the panel pads are arranged increases the relative ratio of the display area in the display device to the peripheral area and reduces the dead space, thereby increasing in freedom of design of the display device.

The above information disclosed in this Background section is only for understanding of the background of the inventive concepts, and, therefore, it may contain information that does not constitute prior art.

SUMMARY

Display panels and display devices including display panels constructed according to exemplary implementations of the invention have reduced dead space compared to conventional designs.

According to the principles and exemplary implementations of the invention, the display panels and display devices including the same have a minimized or reduced pad area while maintaining connection reliability with a connection circuit board. For example, the inclinations and the pitches of the pads of the pad groups may be changed to optimize the arrangement of the pads. Thus, when compared to display panels having constant inclination and pitch, even though the same number of pads are provided, the pad area according to the principles and some exemplary implementations of the invention may be have relatively reduced length and dead space. In addition, the inclinations and the pitches of the pads may be optimized to maintain sufficient contact area with the connection member, thereby realizing good reliability while reducing the dead space.

Additional features of the inventive concepts will be set forth in the description which follows, and in part will be apparent from the description, or may be learned by practice of the inventive concepts.

According to one or more embodiments of the invention, a display panel includes: a display substrate having a display area to display an image, and a pad area disposed on at least one side of the display area; and a plurality of pad groups arranged on the pad area in a first direction, the plurality of pad groups includes: a first pad group having a plurality of first pads, at least some of the plurality of first pads have a first inclination with respect to a reference line extending in a second direction different from the first direction, and the plurality of first pads being spaced from each other at a first pitch; and a second pad group having a plurality of second pads, at least some of the plurality of second pads having a second inclination, which is different from the first inclination, with respect to the reference line, and the plurality of second pads being spaced from each other at a second pitch different from the first pitch.

The first pad group may be disposed on a central portion of the pad area, and the second pad group may be disposed on at least one side of the first pad group.

The second inclination may be greater than the first inclination, and the second pitch may be less than the first pitch.

The second inclination may be greater than 0 degrees and may be equal to or less than about 50 degrees.

The second pad group may include: a plurality of first sub pad groups disposed on one side of the first pad group; and a plurality of second sub pad groups disposed on the other side of the first pad group.

Each of the first sub pad groups and the second sub pad groups may include the second pads, wherein the second inclinations of the second pads of the first sub pad groups may be different from each other, and wherein the second inclinations of the second pads of the second sub pad groups may be different from each other.

The second inclinations of the second pads of the first sub pad groups may increase in the first direction outwardly from the central portion toward the end of the pad area, and the second pitch between the second pads may decrease in the first direction outwardly from the central portion toward the end of the pad area.

The second inclinations of the second pads of the second sub pad groups may increase in the first direction outwardly from the central portion toward the end of the pad area, and the second pitch between the second pads may decrease in the first direction outwardly from the central portion to the end of the pad area.

The second pads of an n-th first sub pad group from the first pad group in one direction and the second pads of an n-th second sub pad group from the first pad group in the other direction may be disposed generally symmetrical to each other with respect to the first pad group, where the n may be an integer equal to or greater than 1.

At least one of a first reference line and a second reference line defined by connecting respective ends of the first pads and the second pads may be a curved line, and the first reference line may be defined adjacent to the display area, and the second reference line may be defined adjacent to an edge of the display substrate.

The first reference line may be a curved line convex toward the display area, and the second reference line may be a straight line parallel to the edge of the display substrate.

The first reference line may be a substantially straight line extending generally parallel to the edge of the display substrate, and the second reference line may be a curved line convex toward the edge of the display substrate.

At least some of the first pads and the second pads may have a rectangular shape, the at least some of the first pads may have a first length and a first width, and the at least some of the second pads may have a second length greater than the first length and a second width less than the first width.

A first surface area of at least some of the first pads and a second surface area of at least some of the second pads may be substantially the same.

According to one or more embodiments of the invention, a display panel includes: a display substrate having a display area to display an image, and a pad area disposed on at least one side of the display area; a plurality of pad groups arranged on the pad area in a first direction; and a plurality of connection lines disposed between the display area and the pad area, wherein the plurality of pad groups include: a first pad group having a plurality of first pads, at least some of the plurality of first pads having a first inclination with respect to a reference line extending in a second direction different the first direction, and the plurality of first pads are spaced at a first pitch; and a second pad group having a plurality of second pads, at least some of the plurality of second pads having a second inclination with respect to the reference line different from the first inclination, and the plurality of second pads being spaced at a second pitch between different from the first pitch.

The connection lines may include: a first connection line including: a first sub line part extending from the display area toward the pad area; and a second sub line part extending from the first sub line part and connected to the first pads; and a second connection line including: a third sub line part extending from the display area toward the pad area; and a fourth sub line part extending from the third sub line part and connected to the second pads, wherein the second sub line part has a third inclination with respect to the reference line, and the fourth sub line part has a fourth inclination with respect to the reference line different from the third inclination.

The first inclination and the third inclination may be substantially the same, and the second inclination and the fourth inclination may be substantially the same.

According to one or more embodiments of the invention, a display device includes: a display panel having a display area and a pad area disposed on at least one side of the display area, the pad area including a plurality of pad groups arranged in a first direction; and a connection circuit board including a plurality of connection pad groups coupleable to the pad groups, wherein the pad groups include: a first pad group having a plurality of first pads, at least some of the plurality of first pads having a first inclination with respect to a reference line extending in a second direction different the first direction, and spaced apart from each other at a first pitch; and a second pad group having a plurality of second pads, at least some of the plurality of second pads having a second inclination with respect to the reference line different from the first inclination, and spaced apart from each other at a second pitch different from the first pitch, wherein the connection pad groups include: a first connection pad group having first connection pads coupleable to the first pads; and a second connection pad group having second connection pads coupleable to the second pads.

The first pad group may be disposed on a central portion of the pad area, and the second pad group may be disposed on at least one side of the first pad group, the second inclination may be greater than the first inclination, and wherein the second pitch may be less than the first pitch.

At least some of the first pads and the second pads has a rectangular shape, and the at least some of the first pads may have a first length and a first width, and at least some of the second pads may have a second length greater than the first length and a second width less than the first width.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
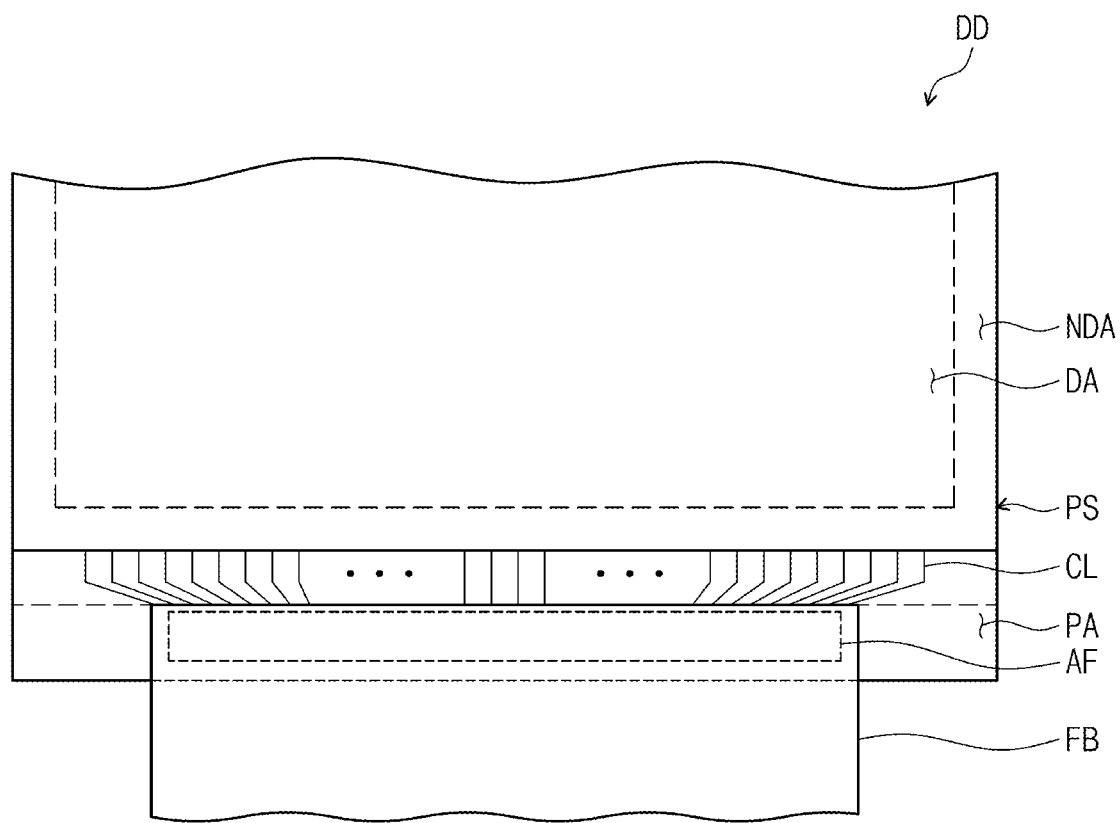
FIG. 1 is a plan view of a portion of a display device constructed according to an exemplary embodiment of the invention.
Figure 1:
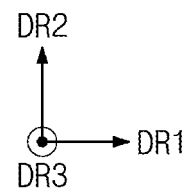

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly disposed", "directly connected to," or "directly coupled to" another element or layer, there are no intervening elements, films, plates, layers, regions of same or the like present. For example, "directly disposed" may mean being disposed without using an additional member such as an adhesion member between two layers or two members. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display panel and a display device according to an exemplary embodiment of the invention will be described with reference to the accompanying drawings.

Figure 2:
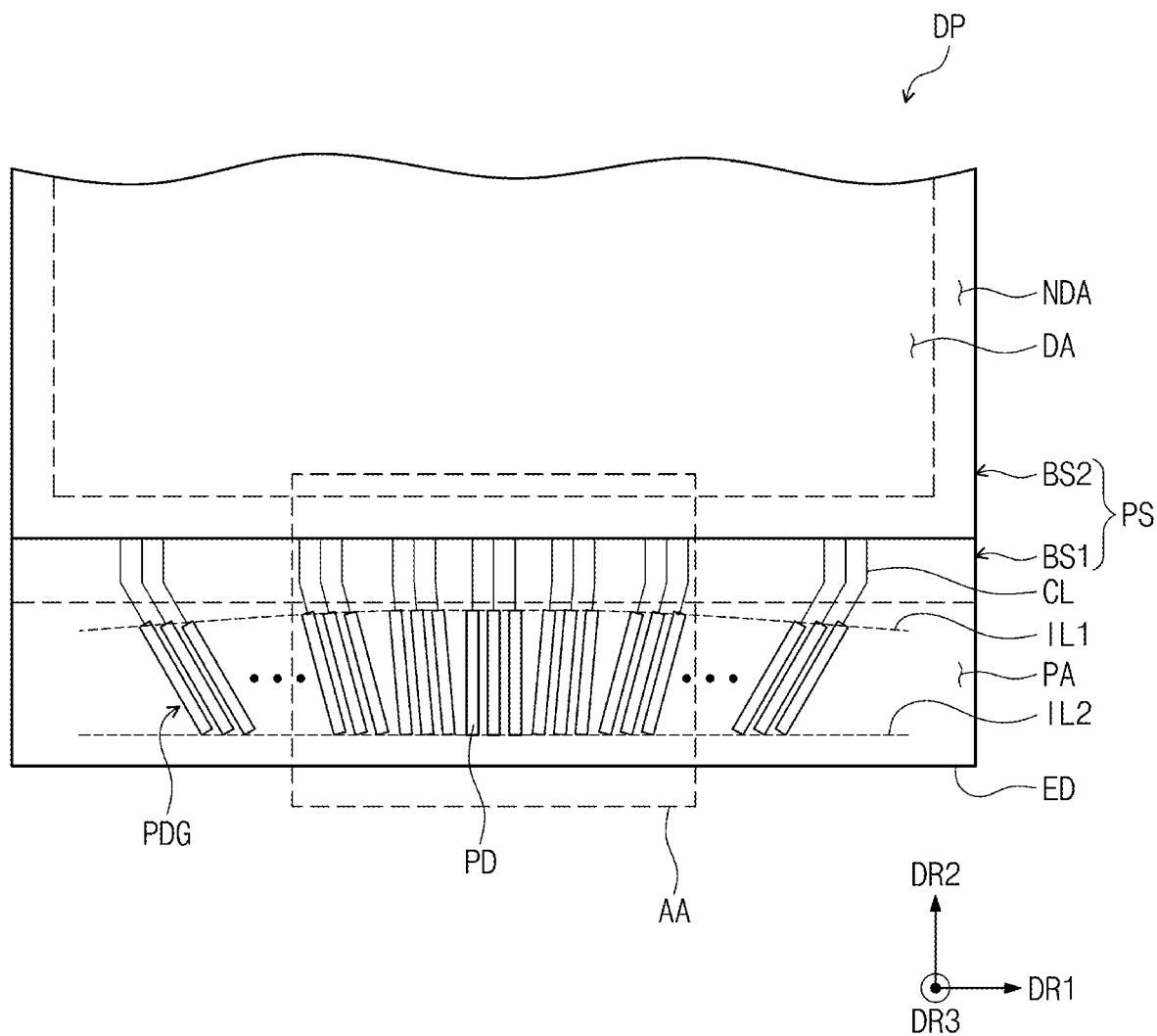
FIG. 2 is a plan view illustrating a portion of the display panel constructed according to an exemplary embodiment of the invention.
Figure 3:
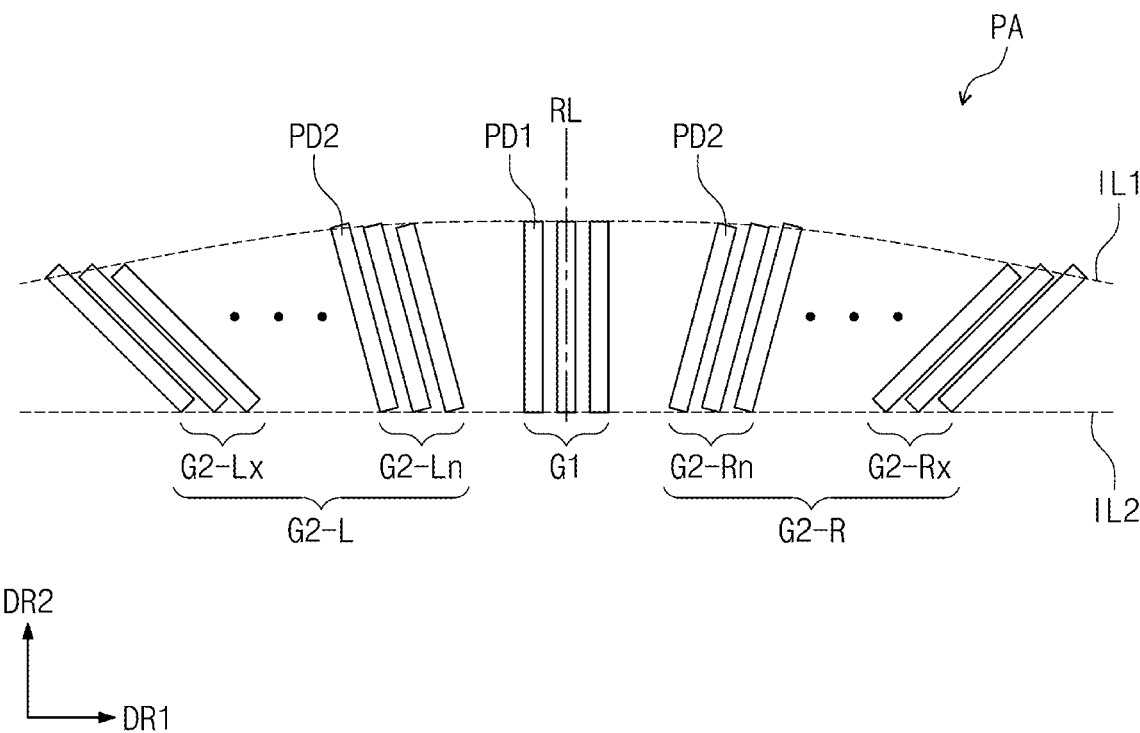
FIG. 3 is a detailed plan view illustrating a portion of a pad area of the display panel constructed according to an exemplary embodiment of the invention.

FIG. 1 is a plan view of a portion of a display device constructed according to an exemplary embodiment of the invention. FIG. 2 is a plan view illustrating a portion of the display panel constructed according to an exemplary embodiment of the invention. FIG. 3 is a detailed plan view of a portion corresponding to a pad area in the display panel of FIG. 2 constructed according to an exemplary embodiment of the invention.

Referring to FIG. 1, a display device DD according to an exemplary embodiment of the invention may include a display panel DP, a connection circuit board FB, and a connection member AF. Also, the display device of the invention may further include a driving circuit board. The connection circuit board FB may be disposed between the display panel DP and the driving circuit board. In the display device DD, the display panel DP and the connection circuit board FB may be electrically connected to each other. Also, the display device DD may further include the connection member AF disposed between the display panel DP and the connection circuit board FB.

The display panel DP may include a liquid crystal display panel, an organic light emitting display panel, a plasma display panel, an electrophoretic display panel, a microelectromechanical system (MEMS) display panel, an electrowetting display panel or the like. For example, in the display device DD, the display panel DP may be a liquid crystal display panel or a organic light emitting display panel. However, the exemplary embodiments are not limited thereto.

The display panel DP may be flexible. "Flexible" means a bendable property and may include a structure that is completely folded to a few nanometers in thickness. For example, the display panel DP may be a curved display panel or a foldable display panel. Also, the display panel DP may be rigid.

Referring to FIGS. 1, 2, and 3, the display panel DP may include a display substrate PS and a plurality of pad groups PDG. The display substrate PS may include a display area DA and a pad area PA. The display substrate PS may be divided into the display area DA, a non-display area NDA, and the pad area PA. The pad groups PDG may be disposed on the pad area PA. Connection lines may be disposed between the display area DA and the pad area PA.

Although the display substrate PS includes first and second substrates BS1 and BS2 in FIGS. 2 and 3, the exemplary embodiments are not limited thereto. The display substrate PS may include a plurality of pixels disposed on the display area DA. For example, the display substrate PS may be a liquid crystal display substrate. Particularly, in an exemplary embodiment, the display substrate PS may be a liquid crystal display substrate including a liquid crystal layer disposed between the first and second substrates BS1 and BS2.

However, the exemplary embodiments are not limited thereto. For example, the display substrate PS may be an organic light emitting display substrate. In the case of the organic light emitting display substrate, the display substrate PS may include a base substrate and an organic light emitting device layer disposed on the base substrate.

Also, the display substrate PS may include a display element and be a plasma display substrate, an electrophoretic display substrate, a microelectromechanical system (MEMS) display substrate, an electrowetting display substrate, or the like.

The display area DA displays an image and is generally parallel to a plane defined by a first directional axis DR1 and a second directional axis DR2. For example, the display panel DP may provide an image in a direction of a third directional axis DR3. For convenience of description, a direction in which an image is provided from the display device DD may be defined as an upward direction, and a direction opposite to the upward direction may be defined as a downward direction. In this specification, directions indicated by the first, second, and third directional axes DR1, DR2, and DR3 will be described as first, second, and third directions DR1, DR2, and DR3. That is, in this specification, the first to third directions DR1, DR2, and DR3 may be the same as the directions of the first to third directional axes DR1, DR2, and DR3. In this embodiment, upward and downward directions are parallel to the third direction DR3 that is defined as a direction perpendicular to the first direction DR1 and the second direction DR2. The third direction DR3 may be a reference direction for dividing front and rear surfaces of components that will be described below. However, the upward direction and the downward direction may be a relative concept and thus be changed in different directions.

The non-display area NDA is adjacent to the display area DA. The non-display area NDA may surround an edge of the display area DA and be disposed outside the display area DA. However, the exemplary embodiments are not limited thereto. For example, the non-display area NDA may be provided on only an edge of at least one side of the display area DA. Although the non-display area NDA has a frame shape surrounding the display area DA in the illustrated embodiment, the exemplary embodiments are not limited thereto.

The pad area PA may be disposed on at least one side of the display area DA. The pad area PA may be adjacent to the non-display area NDA. The pad area PA may be disposed outside the non-display area NDA, but exemplary embodiments are not limited thereto.

The pad area PA may be an area on which the connection circuit board FB and the display substrate PS are coupled. The display panel DP may be electrically connected to external electronic components such as the connection circuit board FB and a driving circuit board through pads PD disposed on the pad area PA.

The pads PD arranged in the first direction DR1 may be disposed on the pad area PA of the display panel DP. In the pad area PA, a plurality of pad groups PDG may be arranged in the first direction DR1.

The display substrate PS may receive an electrical signal from the outside or output an electrical signal to the outside through the pads PD disposed on the pad area PA. For example, the pads PD may be input pads. The pads PD may be connected to connection lines CL.

The pads PD may be electrically connected to the connection circuit board FB. Each of the pads PD may include a metal such as copper (Cu), silver (Ag), or gold (Au) or metal oxide. For example, each of the pads PD may include at least one transparent metal oxide such as indium tin oxide (ITO), indium zinc oxide (IZO), indium tin zinc oxide (ITZO), zinc tin oxide (ZTO), and antimony tin oxide (ATO). Particularly, ITO may be patterned on each of the pads PD. Also, the pads PD may be electrically connected to a driving device, which drives pixels of the display substrate PS, through the connection lines CL.

The pad groups PDG may be arranged in the first direction DR1. The pad groups PDG may include a first pad group G1 having a first inclination with respect to a reference line RL and including a plurality of first pads PD1, which are spaced a first distance from each other, second pad groups G2-R and G2-L having a second inclination with respect to the reference line RL and including a plurality of second pads PD2, which are spaced a second distance from each other. The reference line RL may be a virtual line that is parallel to the second direction DR2 normal to the first direction DR1. The inclination of each of the pads PD1 and PD2 may represent an angle between an extension direction of the reference line RL and an extension direction of the first or second pads PD1 and PD2. In this specification, the inclination value may be a positive value and be an acute angle.

The first inclination of each of the first pads PD1 of the first pad group G1 may be different from the second inclination of each of the second pads PD2 of the second pad groups G2-R and G2-L. Also, the first distance between the first pads PD1 of the first pad group G1 may be different from the second distance between the second pads PD2 of the second pad groups G2-R and G2-L.

In an exemplary embodiment, the plurality of pad groups PDG may include the first pad group G1 disposed at a central portion of the pad area PA and the second pad groups G2-R and G2-L disposed on at least one side of the first pad group G1. The inclination of each of the second pads PD2 of the second pad groups G2-R and G2-L may be greater than that of each of the first pads PD1 of the first pad group G1. Also, the distance between the second pads PD2 may be less than that between the first pads PD1.

The second pad groups may include first sub pad groups G2-R disposed on one side of the first pad group G1 and second sub pad groups G2-L disposed on the other side of the first pad group G1. For example, in the display panel DP according to the illustrated embodiment, the first sub pad groups G2-R may be disposed at a right side of the first pad group G1, and the second sub pad groups G2-L may be disposed at a left side of the first pad group G1.

The display panel DP may include a first pad group G1 disposed on a central portion of the pad area PA, x number of first sub pad groups G2-R disposed at a right side of the first pad group G1, and x number of second pad groups G2-L disposed at a left side of the first pad group G1. The number x is an integer equal to or greater than 1, and the number of first sub pad groups G2-R and the number of second sub pad groups G2-L may be the same or different from each other.

The plurality of first sub pad groups G2-R may be disposed to be arranged outwardly from the central portion of the pad area PA. The inclinations of the second pads PD2 included in different first sub pad groups G2-R may be different from each other.

The inclinations of the second pads PD2 of the first sub pad groups G2-R may gradually increase outward from the central portion of the pad area PA. For example, referring to FIG. 3, the inclination of each of the second pads PD2 of the first sub pad group G2-Rn that is disposed in an n-th group from the first pad group G1 disposed at the central portion may be different from that of each of the second pads PD2 of the first sub pad group G2-Rx that is disposed in an x-th group from the first pad group G1. Particularly, the inclinations of the second pads PD2 with respect to the reference line RL may gradually increase toward the first sub pad group G2-R that is further spaced apart from the central portion of the pad area PA.

Also, the inclinations of the second pads PD2 included in different second sub pad groups G2-L may be different from each other. The inclinations of the second pads PD2 of the second sub pad groups G2-L may gradually increase outward from the central portion. For example, referring to FIG. 3, the inclination of each of the second pads PD2 of the second sub pad group G2-Ln that is disposed in an n-th group from the first pad group G1 disposed at the central portion of the pad area PA may be different from that of each of the second pads PD2 of the second sub pad group G2-Lx that is disposed in an x-th group from the first pad group G1. Particularly, the inclinations of the second pads PD2 with respect to the reference line RL may gradually increase toward the second sub pad group G2-L that is spaced furthest from the central portion of the pad area PA.

The pitch between the second pads PD2 of the first sub pad groups G2-R may be different from each other. The distances between the second pads PD2 of the first sub pad groups G2-R may gradually decrease outwardly from the central portion of the pad area PA. For example, referring to FIG. 3, the distance between the second pads PD2 of the first sub pad group G2-Rn that is disposed in an n-th group from the first pad group G1 disposed at the central portion may be different from that between the second pads PD2 of the first sub pad group G2-Rx that is disposed in an x-th group from the first pad group G1. Particularly, the distance between the second pads PD2, i.e., pitches of the second pads PD2 may gradually decrease toward the first sub pad group G2-R that is spaced furthest from the central portion. In this specification, the distance between the pads may mean a minimum distance from a center of one pad to a center of the other pad of the adjacent pads, which is called "pitch."

That is, to dispose the defined pads PD1 and PD2 within the limited pad area PA, the pitches between the pads PD1 and PD2 may gradually decrease toward the outside of the pad area PA.

Also, the distances between the second pads PD2 of the second sub pad groups G2-L may be different from each other. The distances between the second pads PD2 of the second sub pad groups G2-L also may gradually decrease outwardly from the central portion of the pad area PA. For example, referring to FIG. 3, the distance between the second pads PD2 of the second sub pad group G2-Ln that is disposed in an n-th group from the first pad group G1 disposed at the central portion may be different from that between the second pads PD2 of the second sub pad group G2-Lx that is disposed in an x-th group from the first pad group G1. Particularly, the distances between the second pads PD2, i.e., a pitch of each of the second pads PD2 may gradually decrease toward the second sub pad group G2-L that is further spaced apart from the central portion.

The first sub pad groups G2-R and the second sub pad groups G2-L may be disposed generally symmetrical to each other with respect to the first pad group G1. For example, the second pads PD2 of the first sub pad group G2-R that is disposed in an n-th group from the first pad group G1 in one side direction and the second pad PD2 of the second sub pad group G2-L that is disposed in an n-th group from the first pad group G1 in the other side direction may be disposed generally symmetrical to each other with respect to the first pad group G1. Particularly, the second pads PD2 of the first sub pad group G2-R that is disposed in the n-th group from the first pad group G1 in one side direction and the second pad PD2 of the second sub pad group G2-L that is disposed in the n-th group from the first pad group G1 in the other side direction may have substantially the same inclination and substantially the same pitch. However, the inclined direction of the second pads PD2 of the first sub pad group G2-R and the inclined direction of the second pads PD2 of the second sub pad group G2-L may be opposite to each other and symmetrical to each other with respect to the first pad group G1 or the reference line RL. In this specification, the symmetrical arrangement may mean line symmetry.

Figure 4:
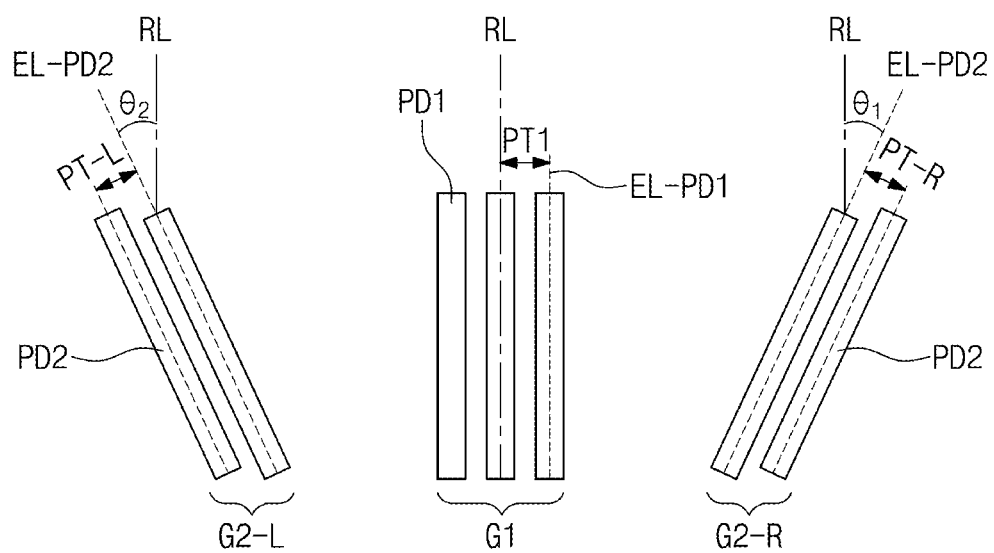
FIG. 4 is a plan view illustrating an arrangement of pad groups constructed according to an exemplary embodiment of the invention.

FIG. 4 is a plan view illustrating an arrangement of the pad groups constructed according to an exemplary embodiment of the invention, and portions of the first pad group G1 and the second pad groups G2-R and G2-L are illustrated in FIG. 4. Referring to FIG. 4, an extension direction EL-PD2 of the second pads PD2 of the first sub pad group G2-R may have an angle $\theta_1$ with respect to the reference line RL that is a virtual line, and each of the second pads PD2 may have a pitch of a value PT-R. Also, an extension direction EL-PD2 of the second pads PD2 of the second sub pad group G2-L may have an angle $\theta_2$ with respect to the reference line RL that is the virtual line, and each of the second pads PD2 may have a pitch of a value PT-L. When the first sub pad group G2-R and the second sub pad group G2-L, which are illustrated in FIG. 4, are arranged on positions that are generally symmetrical to each other with respect to the first pad G1, the angles $\theta_1$ and $\theta_2$ may be substantially the same, and the values PT-R and PT-L may be substantially the same.

The extension direction EL-PD1 of the first pads PD1 of the first pad group G1 may be generally parallel to the reference line RL. That is, each of the first pads PD1 may have an inclination of 0 degree. The distance PT1 between the first pads PD1 may be greater than the distance PT-R between the second pads PD2 of the first sub pad group G2-R and the distance PT-L between the second pads PD2 of the second sub pad group G2-L.

Figure 5:
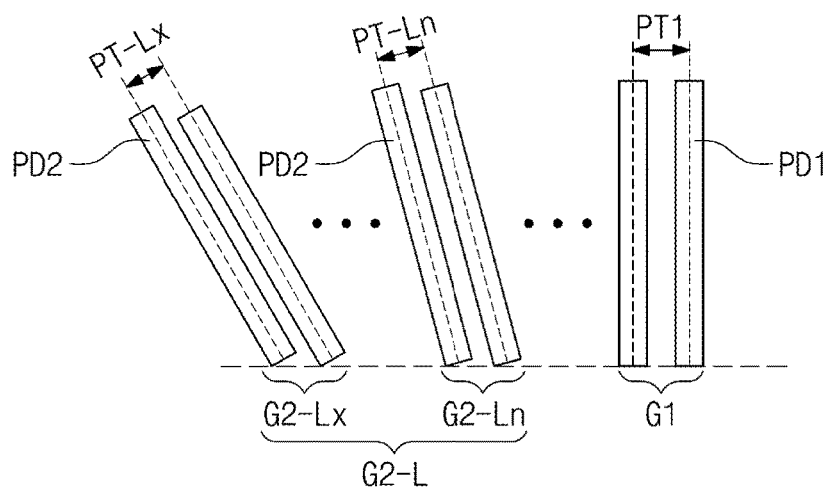
FIG. 5 is a plane view illustrating an arrangement of pad groups constructed according to an exemplary embodiment of the invention.

FIG. 5 is a plan view illustrating an arrangement of the pad groups constructed according to an exemplary embodiment of the invention, and portions of the first pad group G1 and the second pad group G2-L are illustrated in FIG. 5. Referring to FIG. 5, the pitch between the second pads PD2 of the second sub pad group G2-L may gradually decrease in a direction that is away from the first pad group G1. In FIG. 5, the pitch between the second pads PD2 of PT-Ln and PT-Lx of the second sub pad group G2-L may be less than that PT1 between the first pads PD1 of the first pad group G1. Also, the pitch PT-Lx between the second pads PD2 of the second sub pad group G2-Lx, which are spaced apart from each other, in the x-th group from the first pad group PD2, may be less than the pitch PT-Ln of the second pads PD2 of the second sub pad group G2-Ln, which are spaced form each other, in the n-th group from the first pad group G1.

Figure 6:
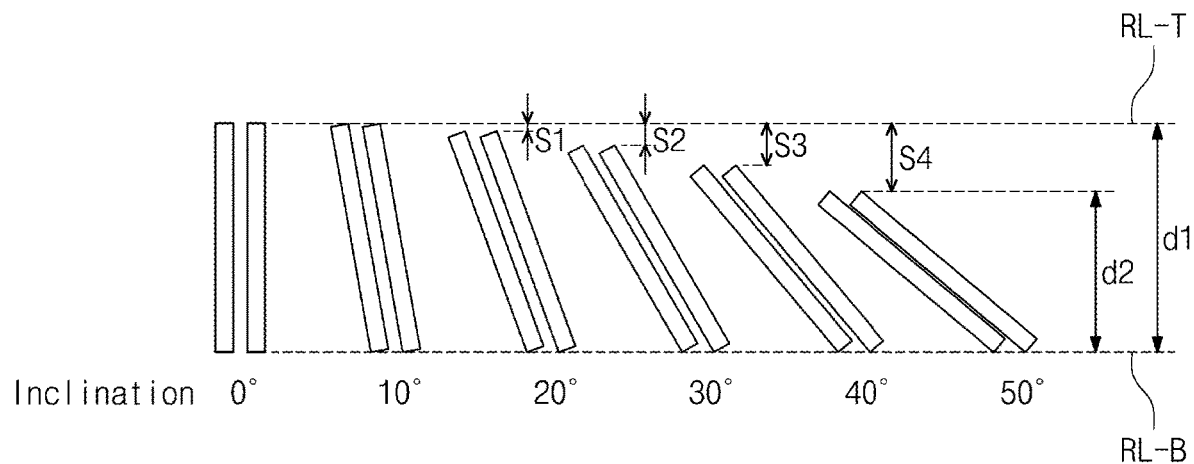
FIG. 6 is a plan view illustrating a variation in vertical length depending on inclinations of pads.

FIG. 6 is a plan view illustrating a variation in vertical length of the pads depending on inclinations of pads. In FIG. 6, the inclinations of the pads mean inclination values of the pads with respect to the reference line (see reference symbol RL of FIG. 4) that is generally parallel to the second direction DR2 perpendicular to the first direction DR1, respectively.

Referring to FIG. 6, the vertical length of each of the pads decreases as the inclination value of each of the pads increases. The vertical length of the pad may mean a maximum height in the vertical direction with respect to a lower end of the pad. The vertical length when the pad is disposed at a predetermined inclination with respect to a distance d1 between an upper end and a lower end of the pad having an inclination of 0 degree may be less than the distance d1. For example, a vertical length of the pad having an inclination of about 50 degrees may be a distance d2.

In FIG. 6, when a portion corresponding to the lower end of the pad having the inclination of about 0 degree is referred to as a lower reference line RL-B, and a portion corresponding to the upper end of the pad is referred to as an upper reference line RL-T, as the inclination of the pad increases, distances S1, S2, S3, and S4 between the upper reference line RL-T to the upper end of the pad may gradually increase. That is, as the inclination of the pad increases, the vertical length may decrease. Thus, the vertical length of the pad area may be reduced.

When the pad has a length L, the vertical length d of the pad may satisfy the following equation, where θ is an angle of the inclination of the pad:

$d=L*\cos\theta.$

In an exemplary embodiment illustrated in FIGS. 2, 3, and 4, each of the second pads PD2 may have an inclination that exceeds about 0 degree and is equal to or less than about 50 degrees. That is, the inclination of each of the second pads PD2 with respect to the reference line RL may be greater than that of each of the first pads PD1 of the first pad group. For example, the extension direction of the first pads PD1 may be parallel to the extension direction of the reference line RL. A first inclination of each of the first pads PD1 may have a value of about 0 degree. Thus, the inclination of each of the second pads PD2 may be greater than that of each of the first pads PD1 and have an angle greater than about 0 degree. The inclination of each of the second pads PD2 may be less than about 50 degrees. When the inclination of each of the second pads PD2 is greater than about 50 degrees, the pitch between the second pads PD2 may not be sufficient to avoid short-circuits, thereby deteriorating reliability.

Figure 7A:
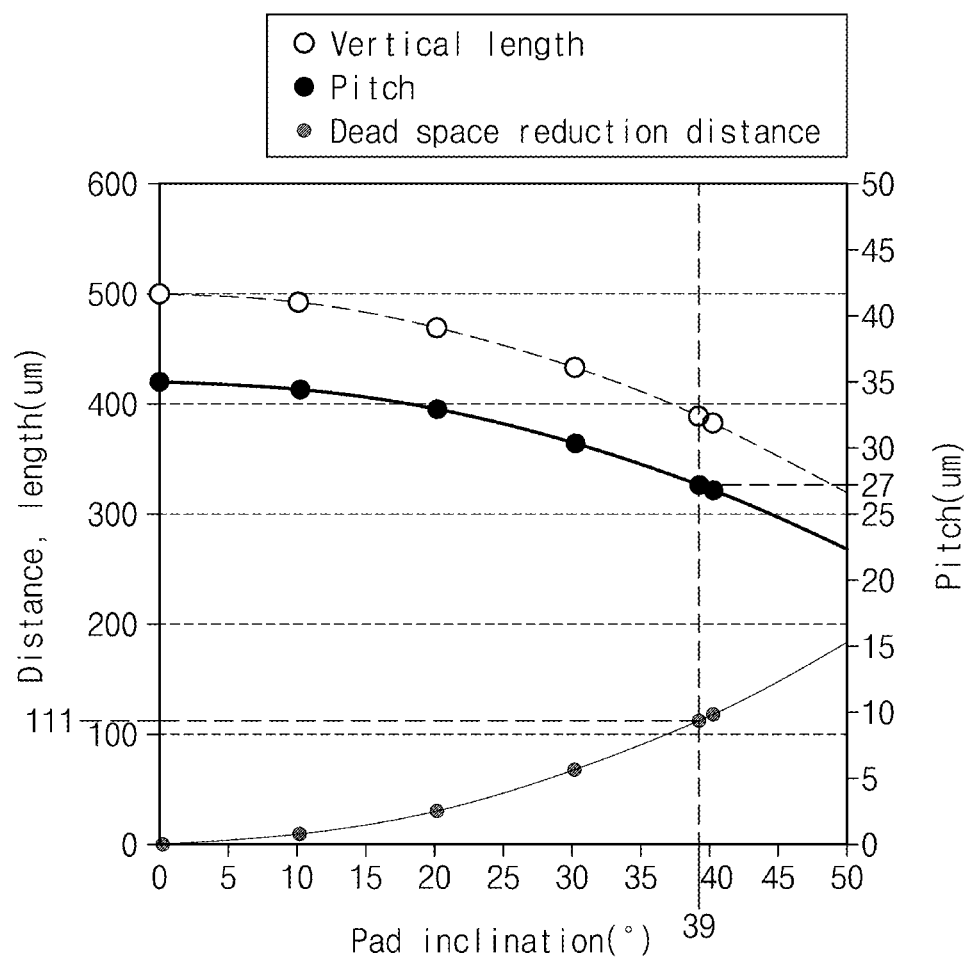
FIGS. 7A, 7B, and 7C are graphs illustrating a relationship between inclination, pitch, and a vertical length of a pad.
Figure 7B:
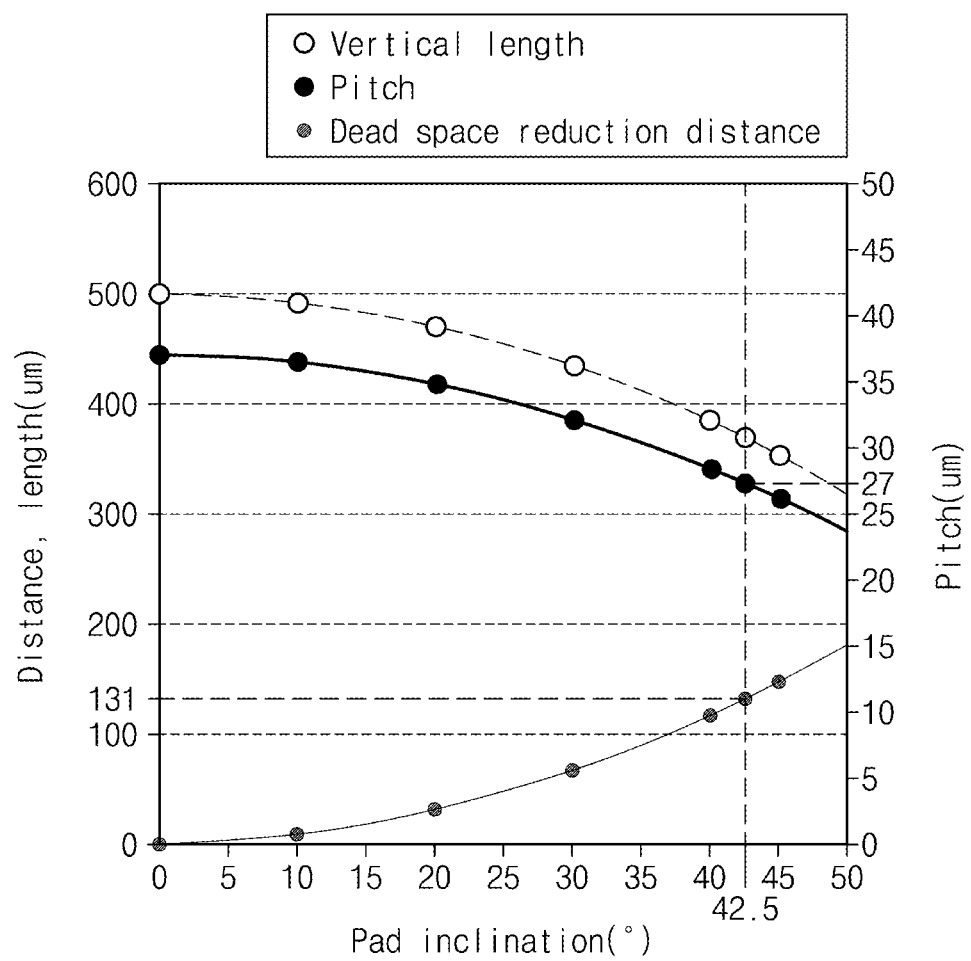
Figure 7C:
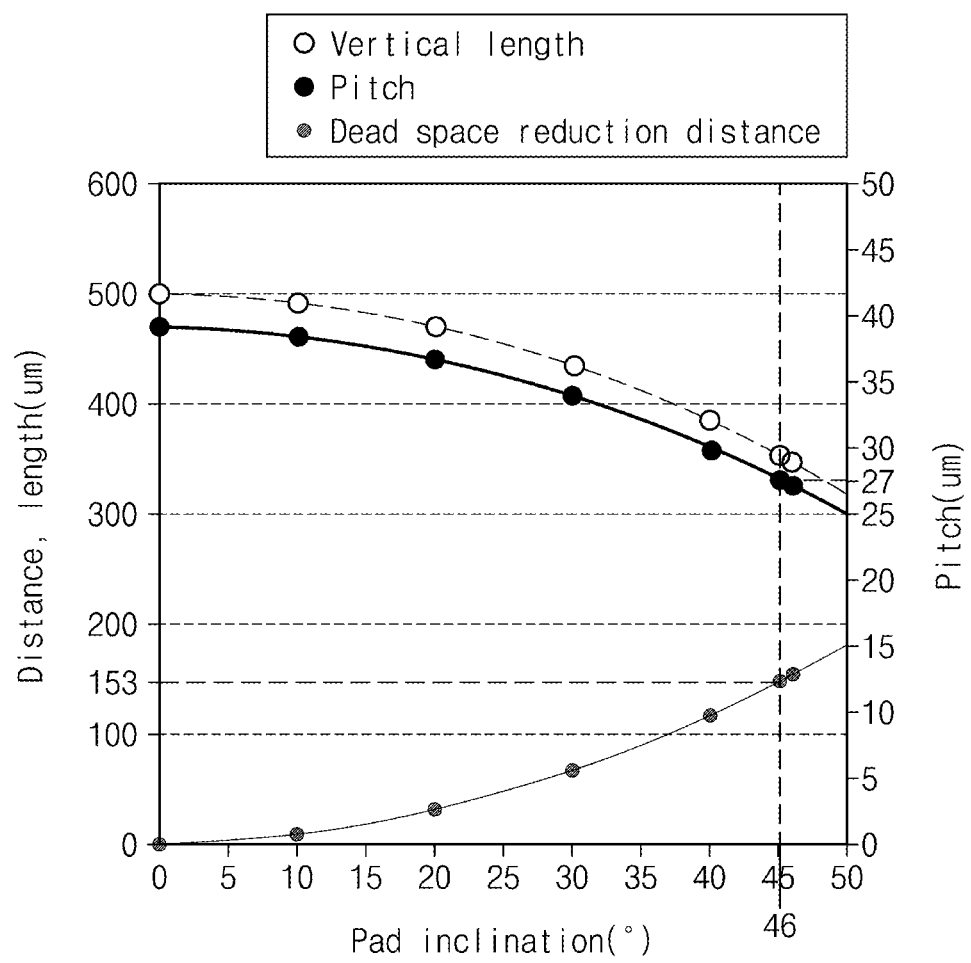

FIGS. 7A, 7B, and 7C illustrate a vertical length of each of the pads, a distance of a dead space, and a pitch between the pads depending on an increase in inclination of the pads. FIG. 7A illustrates a case in which the distance between the pads, i.e., the pitch of the pad is about 35 μm when the pads are not inclined, FIG. 7B illustrates a case in which the pitch of the pad is about 37 μm when the pads are not inclined, and FIG. 7C illustrates a case in which the pitch of the pad is about 39 μm when the pads are not inclined.

Referring to FIG. 7A, the vertical length of the pad decreases, and also the amount of the dead space decreases, as the inclination of the pad increases. FIG. 7A illustrates a case in which the reduction distance of the dead space is 111 μm. When the inclination of the pad decreases within a range of the limited pad area, the pitch of each of the pads disposed within the pad area has to decrease. Thus, if the minimum value of the pad pitch at which reliability is assured is about 27 μm, a maximum value of the inclination of the pad may be about 39 degrees.

FIGS. 7B and 7C illustrate a case in which the vertical length of the pad and the dead space distance decrease as the inclination of each of the pads increases. Here, it is confirmed that the pad pitch decreases as the inclination of the pad increases. FIGS. 7B and 7C illustrate cases in which maximum values of the dead space are about 131 μm and about 153 μm when the maximum value of the pad pitch, at which the reliability is assured, is about 27 μm, respectively. Referring to FIGS. 7A, 7B, and 7C, it is confirmed that a degree of reduction of the dead space increases as the pad pitch increases.

Referring to FIG. 7B, in case in which the pads having an inclination of about 0 degree has a pitch of about 37 μm, when the minimum value of the pad pitch, at which the reliability is assured, is about 27 μm, the maximum value of the inclination of the pad may be about 42.5 degrees. Referring to FIG. 7C, in case in which the pads having an inclination of about 0 degree has a pitch of about 39 μm, when the minimum value of the pad pitch, at which the reliability is assured, is about 27 μm, the maximum value of the inclination of the pad may be about 46 degrees.

That is, referring to FIGS. 7A, 7B, and 7C, the inclination of the pad increases, and the pitch between the pads decreases, to reduce the vertical length on the pad area on which the pad is arranged. Thus, the dead space may be reduced on the display panel according to an exemplary embodiment.

Figure 8:
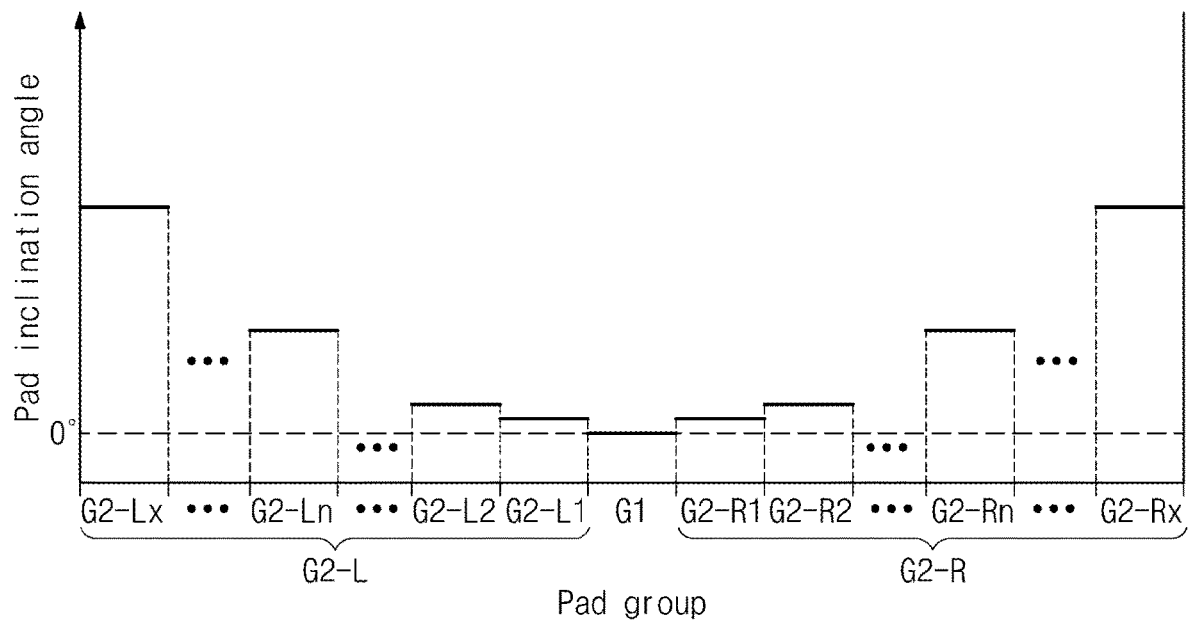
FIG. 8 is a graph illustrating an inclined angle of the pad depending on the pad group according to an exemplary embodiment of the invention.
Figure 9:
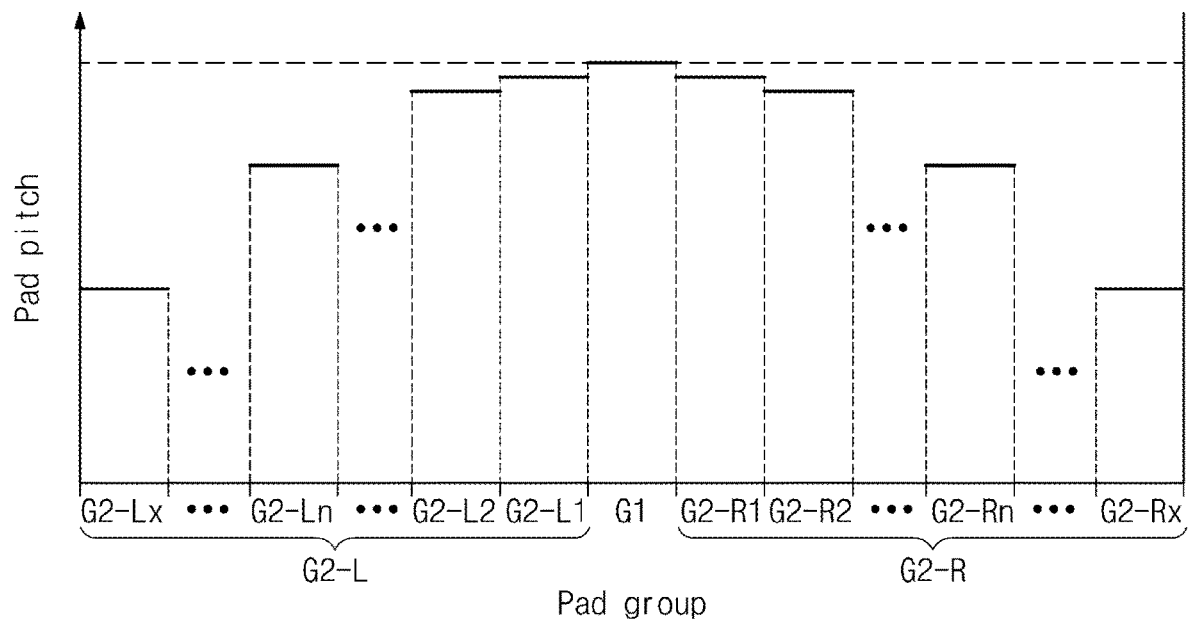
FIG. 9 is a graph illustrating a pitch of the pad depending on the pad group according to an exemplary embodiment of the invention.

FIG. 8 is a graph illustrating an angle of a pad inclination for each pad group, and FIG. 9 is a graph illustrating a pad pitch for each pad group. FIGS. 8 and 9 illustrate an inclination and a pad pitch of the pad in the pad groups provided in the display panel according to the foregoing embodiment.

Referring to FIG. 8, in the display panel according to an exemplary embodiment, each of the pads of the first pad group G1 may have an inclination of about 0 degree. First sub pad groups G2-R1, G2-R2, ..., G2-Rn, ..., G2-Rx disposed at one side of the first pad group G1 may have pad inclination angles that gradually increase as the first sub pad groups G2-R1, G2-R2, ..., G2-Rn, ..., G2-Rx are spaced apart from the first pad group G1. Also, the second sub pad groups G2-L1, G2-L2, ..., G2-Ln, ..., G2-Lx disposed at the other side of the first pad group G1 may have pad inclination angles that gradually increase as being spaced apart from the first pad group G1. The pads of the first sub pad groups G2-R1, G2-R2, ..., G2-Rn, ..., G2-Rx and the second sub pad groups G2-L1, G2-L2, ..., G2-Ln, ..., G2-Lx may have inclination angles that are generally symmetrical to each other with respect to the first pad group G1.

Referring to FIG. 9, the pad pitch value between the pads of the first pad group G1 in the display panel according to an exemplary embodiment may be the largest, and the pitch between the pads of the first sub pad groups G2-R1, G2-R2, ..., G2-Rn, ..., G2-Rx disposed on one side of the first pad group G1 may gradually decrease as spaced apart from the first pad group G1. Also, in the second sub pad groups G2-L1, G2-L2, ..., G2-Ln, ..., G2-Lx disposed at the other side of the first pad group G1, the pitch may gradually decrease as spaced apart from the first pad group G1. The pads of the first sub pad groups G2-R1, G2-R2, ..., G2-Rn, ..., G2-Rx and the second sub pad groups G2-L1, G2-L2, ..., G2-Ln, ..., G2-Lx may have pitches that are generally symmetrical to each other.

That is, referring to FIGS. 2, 3, 4, 5, 6, 7A, 7B, 7C, 8, and 9, the display panel DP may include a plurality of pad groups arranged in the first direction DR1, and the inclinations of the pads of the different pad groups and the pitches between the pads may be different from each other. The inclinations of the plurality of pads of one pad group and the pitches between the pads may be substantially the same. That is, since a different inclination value for each pad group and a different pitch for each pad group are provided, the plurality of pad groups may be arranged to minimize the dead space on the pad area.

Referring to FIGS. 2 and 3, according to an exemplary embodiment, one of a first virtual reference line IL1 connecting ends of one side of the pads PD, which are adjacent to the display area DA, to each other and a second virtual reference line IL2 connecting ends of the other side of the pads, which are adjacent to the edge of the display substrate PS, may be a curved line. That is, according to an exemplary embodiment, the plurality of pad groups PDG may be arranged in a fan shape. The first virtual line IL1 may be a line connecting centers of upper ends of representative pads of each pad group to each other. Also, the second virtual line IL2 may be a line connecting centers of lower ends of representative pads of each pad group to each other. Here, the representative pad of each pad group may be a pad, which is disposed at a center of the pads of each pad group. However, the exemplary embodiments are not limited thereto. For example, the representative pad may be any pad selected from each pad group.

Referring to FIGS. 2 and 3, the first virtual line IL1 may be a curved line, and the second virtual line IL2 may be a straight line. Particularly, the first virtual line IL1 may have a curved line shape that is convex toward the display area DA, and the second virtual line IL2 may have a straight line shape parallel to an edge ED of the display substrate PS.

In the display panel DP, the plurality of pad groups PDG may be arranged in the fan shape, the inclinations of the pad PD of the pad group PDG may gradually increase outward from the central portion of the pad area PA, and the pad pitches may gradually decrease outward from the central portion of the pad area PA to minimize or reduce the pad area PA and the extension of the connection line CL, thereby reducing the dead space.

Figure 10:
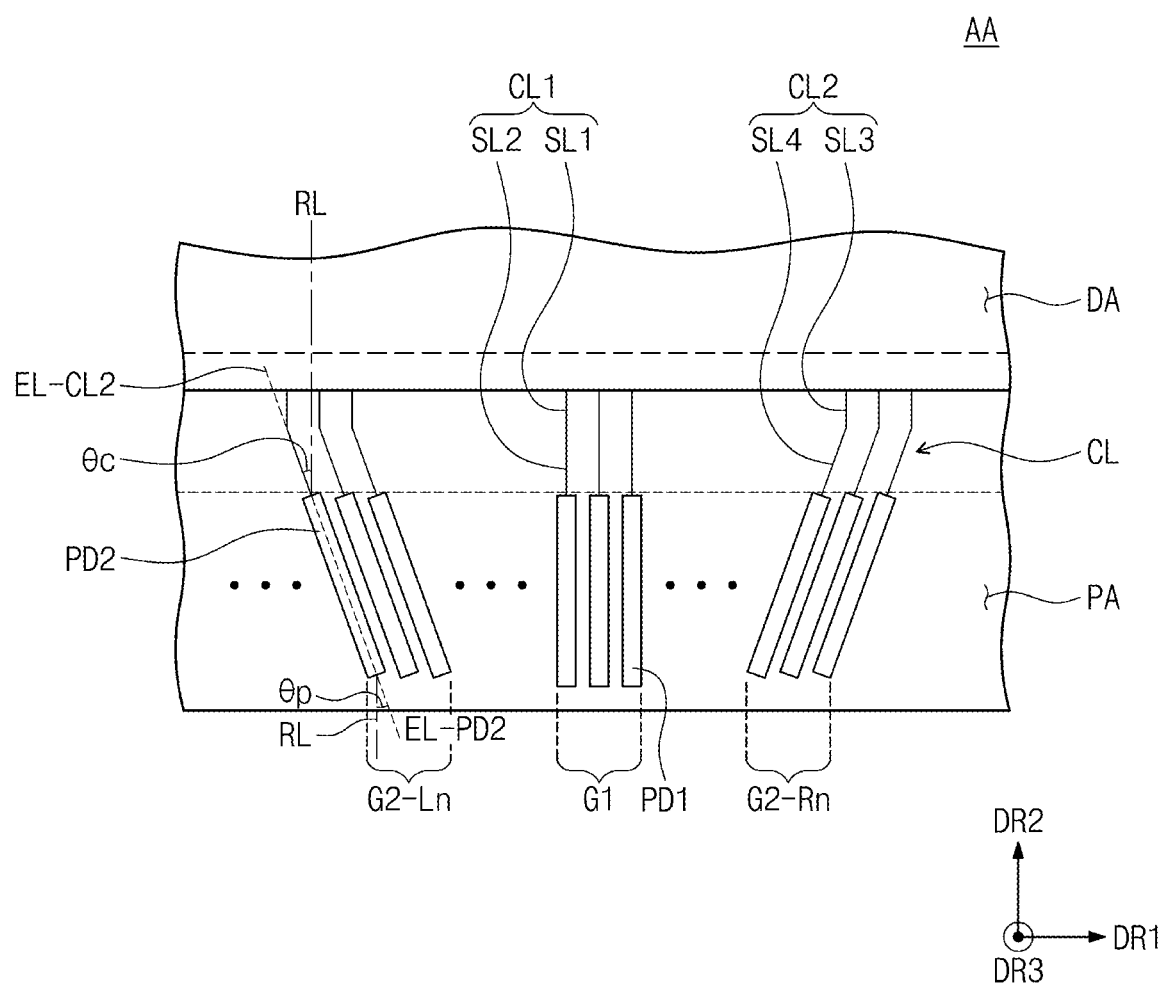
FIG. 10 is a plan view illustrating an area AA of FIG. 2.

FIG. 10 is a plan view illustrating an area AA of FIG. 2. FIG. 10 is an enlarged view illustrating a portion of the display panel DP according to an exemplary embodiment of the invention. FIG. 10 is a plan view illustrating an area AA of FIG. 2. The display panel DP according to an exemplary embodiment may include the display substrate PS, the plurality of pad groups PDG, and the connection lines CL.

The connection lines CL may be disposed between the display area DA and the pad area PA. The connection lines CL may electrically connect pixels disposed on the display area DA to the pads PD.

The connection lines CL may include a first connection line CL1 connected to the first pads PD1 of the first pad group G1 and a second connection line CL2 connected to the second pads PD2 of the second pad groups G2-R and G2-L.

The first connection line CL1 may include a first sub line part SL1 extending in a direction from the display area DA to the pad area PA and a second sub line part SL2 extending from the first sub line part SL1 so as to be connected to the first pads PD1. Also, the second connection line CL2 may include a third sub line part SL3 extending in the direction from the display area DA to the pad area PA and a fourth sub line part SL4 extending from the third sub line part SL3 so as to be connected to the second pads PD2. The first sub line part SL1 and the third sub line part SL3 may be substantially straight line portions extending from the display area DA to the pad area PA and generally parallel to the second directional axis DR2. That is, the first sub line part SL1 and the third sub line part SL3 may be portions extending substantially in parallel to the reference line RL. In an exemplary embodiment, the second sub line part SL2 may be a straight line portion extending from the first sub line part SL1. The extension direction of the second sub line part SL2 may be generally parallel to the extension direction of the first pad PD1 of the first pad group. For example, the second sub line part SL2 may extend in a direction generally parallel to the second directional axis DR2, like the first sub line part SL1. Also, the fourth sub line part SL4 may be a portion diagonally extending from the third sub line part SL3. Here, the second sub line part SL2 and the fourth sub line part SL4 may correspond to a structure generally referred to as spider wirings.

The extension direction of the fourth sub line part SL4 may be generally parallel to the extension direction EL-PD2 of the second pads PD of the first sub pad group G2-Rn or the second sub pad group G2-Ln. For example, referring to FIG. 10, an angle $\theta$, between the reference line RL and the extension direction EL-CL2 of the fourth sub line part SL4 may be substantially the same as an angle $\theta_p$ between the reference line RL and the extension direction EL-PD2 of the second pad PD.

That is, in the case of the display panel DP according to an exemplary embodiment, the second sub line part SL2 and the first pads PD1 of the first pad group G1 connected to the second sub line part SL2 may have substantially the same extension direction, and the fourth sub line part SL4 and the second pads PD2 of the second pad groups G2-R and G2-L connected to the fourth sub line part SL4 may have substantially the same extension direction to minimize lengths of the second sub line part SL2 and the fourth sub line part SL4, which correspond to the structure generally referred to as the spider wirings, thereby reducing the dead space of the display substrate PS.

Figure 11:
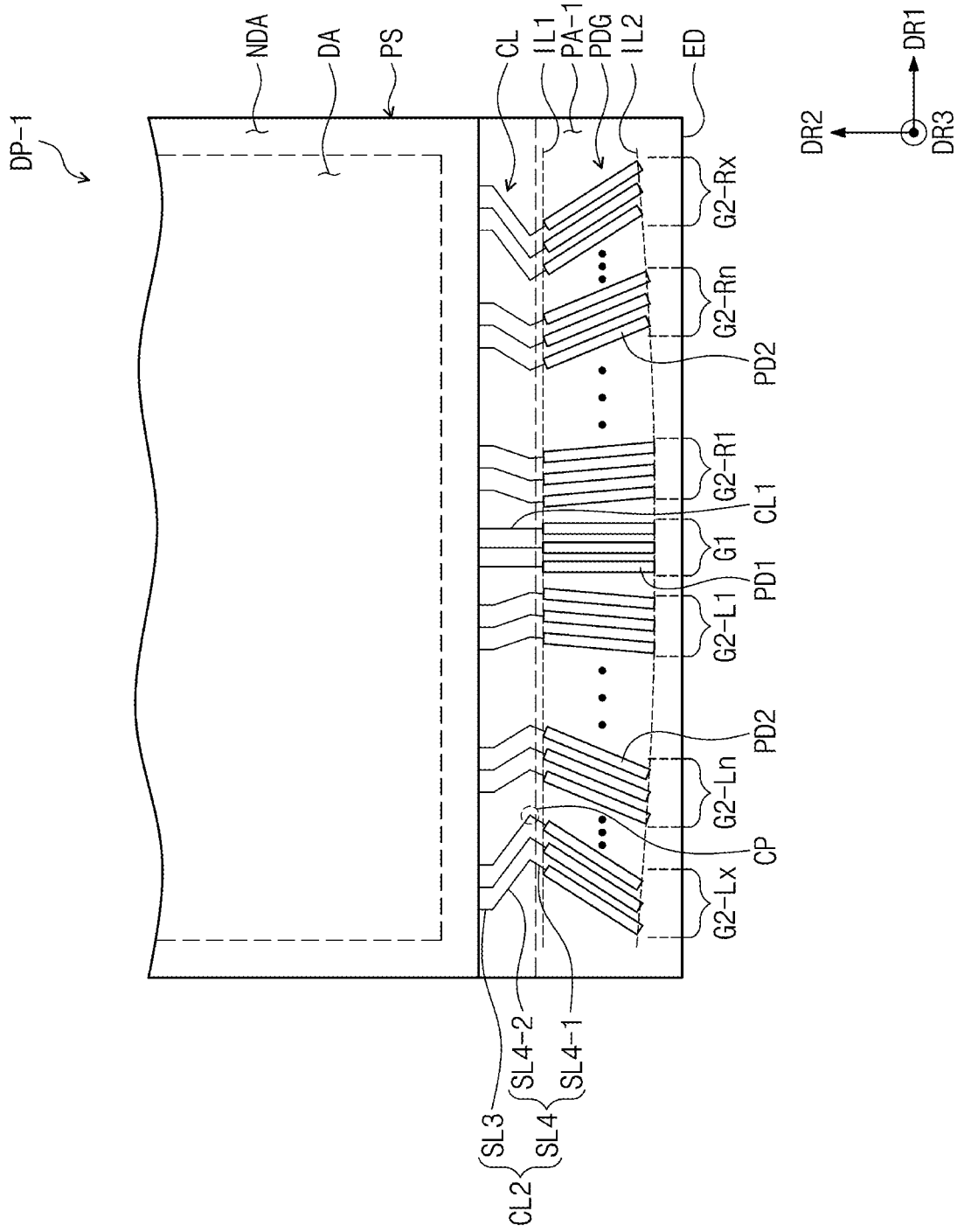
FIG. 11 is a plan view illustrating a portion of the display panel constructed according to an exemplary embodiment of the invention.
Figure 12:
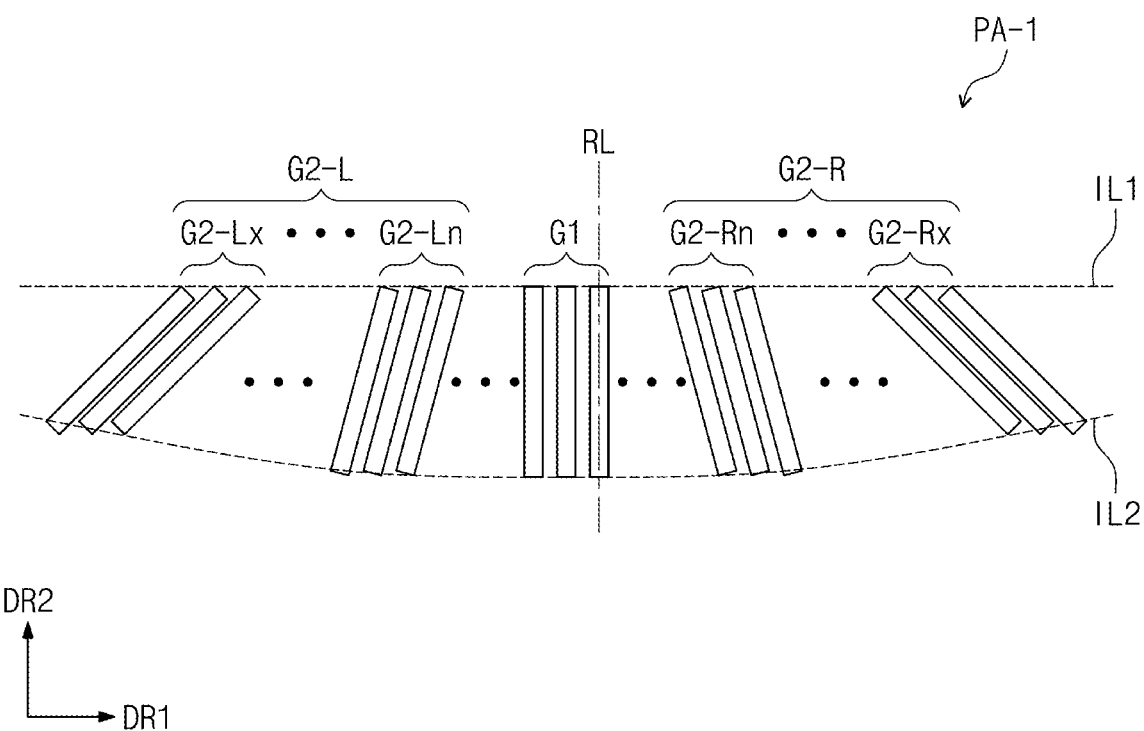
FIG. 12 is a detailed plan view illustrating a portion of a pad area of the display panel constructed according to an exemplary embodiment of the invention.

FIG. 11 is a plan view of the display panel construed according to another exemplary embodiment of the invention. FIG. 12 is a detailed plan view illustrating a portion of the pad area of the display panel constructed according to an exemplary embodiment illustrated in FIG. 11. In the descriptions of FIGS. 11 and 12, contents duplicated with those of the display panel described with reference to FIGS. 1, 2, 3, 4, 5, 6, 7A, 7B, 7C, 8, 9, and 10 will be omitted to avoid redundancy, and thus, their differences will be mainly described. In the description of a display panel DP-1 of FIGS. 11 and 12 according to the exemplary embodiment, the contents described with reference to FIGS. 1, 2, 3, 4, 5, 6, 7A, 7B, 7C, 8, 9, and 10 except for a pad area PA-1, a pad group PDG, and connection lines CL may be equally applied.

The display panel DP-1 of FIG. 11 may include the display substrate PS, the plurality of pad groups PDG, and the connection lines CL. The display substrate PS of the display panel DP-1 may include a display area DA and the pad area PA-1 disposed on at least one side of the display area DA.

The plurality of pad groups PDG may include a first pad group G1 disposed at a central portion of the pad area PA and second pad groups G2-R and G2-L disposed on at least one side of the first pad group G1. The second pad groups G2-R and G2-L may include a first sub pad groups G2-R disposed on one side of the first pad group G1 and a second sub pad group G2-L disposed on the other side of the first pad group G1.

Referring to FIGS. 11 and 12, one of a first virtual reference line IL1 connecting ends of one side of the pads PD1 and PD2, which are adjacent to the display area DA, to each other and a second virtual reference line IL2 connecting ends of the other side of the pads PD1 and PD2, which are adjacent to an edge of the display substrate PS, may be a curved line. That is, the plurality of pad groups PDG may be arranged in a fan shape. The first virtual line IL1 may be a line connecting centers of upper ends of representative pads of each pad group G1, G2-R, and G2-L to each other. Also, the second virtual line IL2 may be a line connecting centers of lower ends of representative pads of each pad group to each other. Here, the representative pad of each pad group may be a pad, which is disposed at a center, of the pads of each pad group. However, the exemplary embodiments are not limited thereto. For example, the representative pad may be any pad selected from each pad group.

Referring to FIGS. 11 and 12, the first virtual line IL1 may be a straight line, and the second virtual line IL2 may be a curved line. Particularly, the first virtual line IL1 may have a straight line shape that is parallel to an edge ED of the display substrate PS, and the second virtual line IL2 may have a curved line shape that is convex toward the edge ED of the display substrate PS.

The plurality of pad groups PDG may include a first pad group G1 disposed at a central portion of the pad area PA and second pad groups G2-R and G2-L disposed on at least one side of the first pad group G1. An inclination of each of the second pads PD2 of the second pad groups G2-R and G2-L may be greater than that of each of the first pads PD1 of the first pad group G1. Also, the pitch between the second pads PD2 may be less than that between the first pads PD1.

The display panel DP-1 may include a first pad group G1 disposed on a central portion of the pad area PA-1, x number of the first sub pad groups G2-R disposed at a right side of the first pad group G1, and x number of the second pad groups G2-L disposed at a left side of the first pad group G1. The number x is an integer equal to or greater than 1, and the number of first sub pad groups G2-R and the number of second sub pad groups G2-L may be substantially the same or different from each other.

The plurality of first sub pad groups G2-R may be disposed to be arranged outward from the central portion of the pad area PA. The inclinations of the second pads PD2 of the first sub pad groups G2-R may be different from each other.

The inclinations of the second pads PD2 of the first sub pad groups G2-R may gradually increase outwardly from the central portion of the pad area PA-1. Also, the inclinations of the second pads PD2 of the second sub pad groups G2-L may gradually increase outwardly from the central portion of the pad area PA.

That is, in the display panel DP-1, the plurality of pad groups PDG may be arranged in the fan shape, the inclinations of the pad of the pad group PDG may gradually increase outward from the central portion, and the pad pitches may gradually decrease outwardly from the central portion to minimize the pad area PA-1, thereby reducing the dead space.

Referring to FIG. 11, the display panel DP-1 may include a first connection line CL1 connected to the first pad group G1 and a second connection line CL2 connected to the second pad groups G2-R and G2-L. The second connection line CL2 may include a third sub line part SL3 extending in the direction from the display area DA-1 to the pad area PA and a fourth sub line part SL4 extending from the third sub line part SL3 so as to be connected to the second pads PD2. In the display panel DP-1, the fourth sub line part SL4 may include at least one curved portion CP. The fourth sub line part SL4 may include a lower sub line pat SL4-1 connected to the second pad PD2 and an upper sub line part SL4-2 disposed between the third sub line part SL3 and the lower sub line part SL4-1. In an exemplary embodiment, the extension direction of the lower sub line part SL4-1 may be parallel to the extension direction of the second pads PD of the first sub pad group G2-Rn or the second sub pad group G2-Ln.

Figure 13:
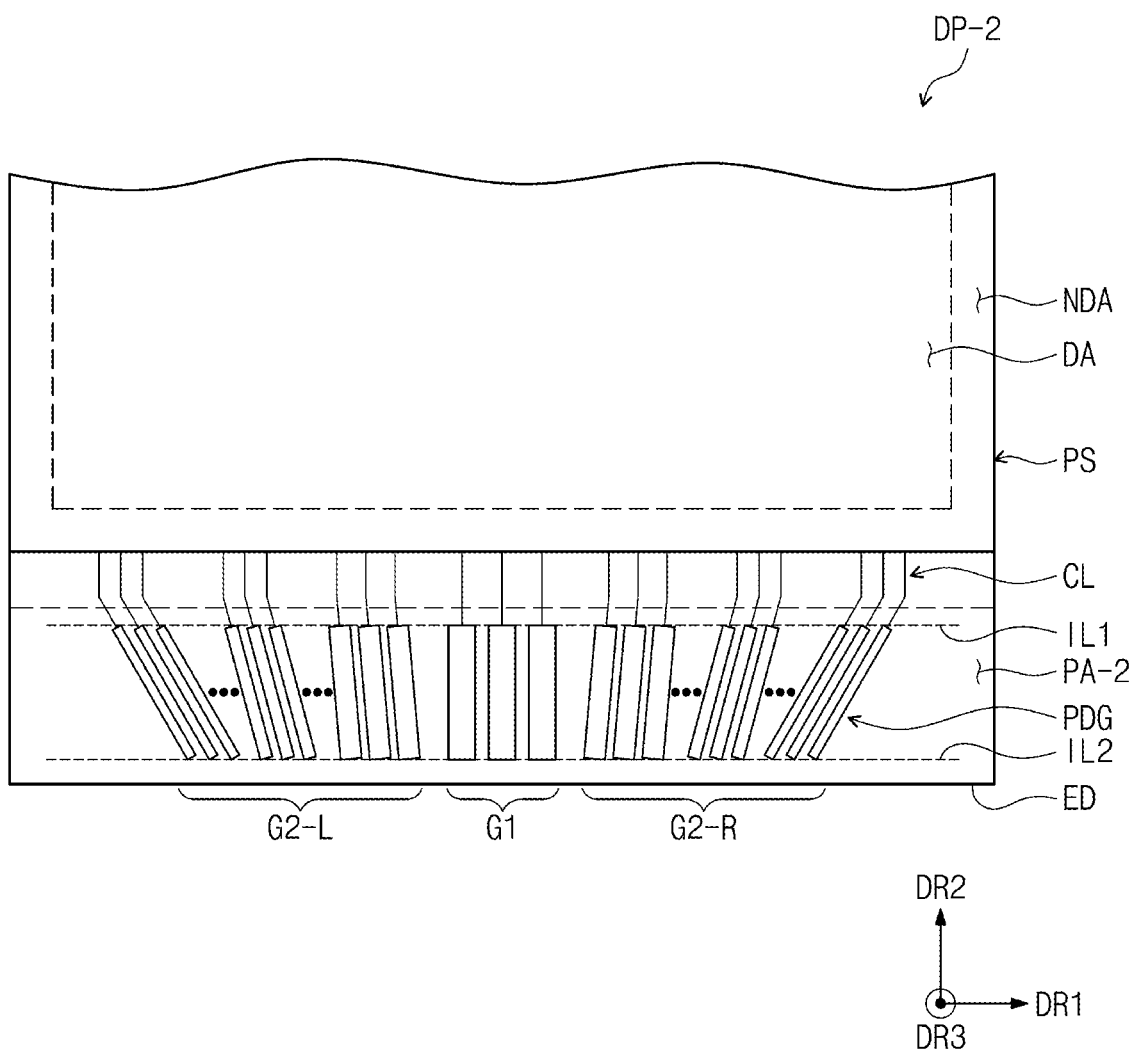
FIG. 13 is a plan view illustrating a portion of a display panel constructed according to an exemplary embodiment of the invention.
Figure 14:
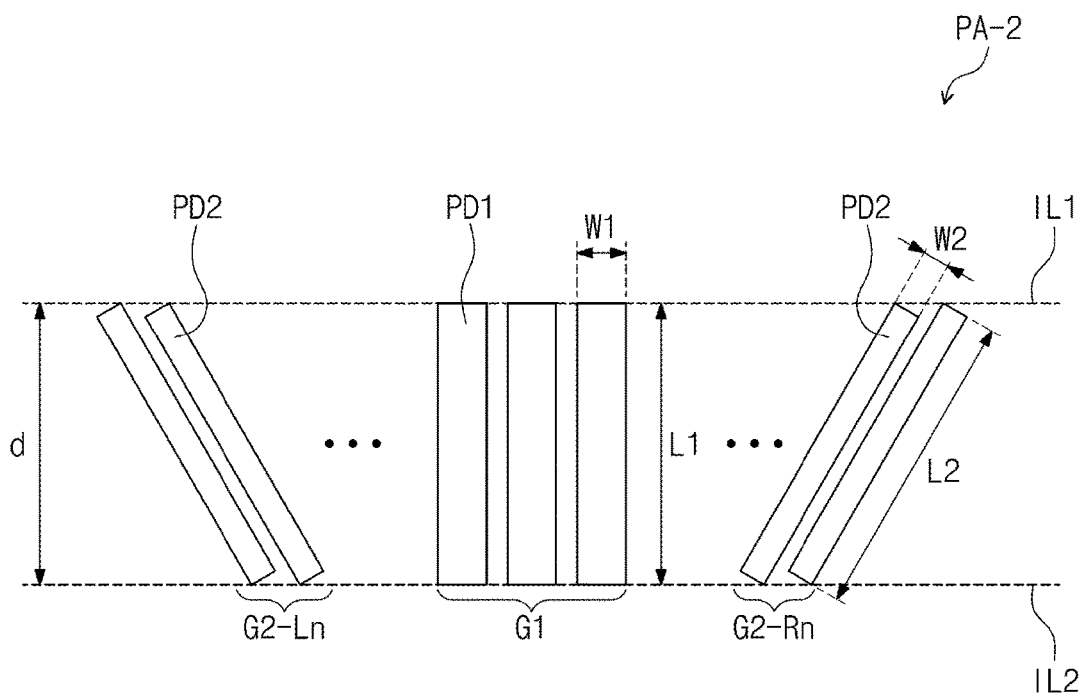
FIG. 14 is a plan view illustrating a portion of a pad area of the display panel constructed according to an exemplary embodiment of the invention.

FIG. 13 is a plan view of the display panel construed according to another exemplary embodiment of the invention. FIG. 14 is a detailed plan view illustrating a portion of the pad area of the display panel constructed according to an exemplary embodiment illustrated in FIG. 13. In the descriptions of FIGS. 13 and 14, contents duplicated with those of the display panel described with reference to FIGS. 1, 2, 3, 4, 5, 6, 7A, 7B, 7C, 8, 9, and 10 will be omitted to avoid redundancy, and thus, their differences will be mainly described. In the description of a display panel DP-2 of FIGS. 13 and 14, the contents described with reference to FIGS. 1, 2, 3, 4, 5, 6, 7A, 7B, 7C, 8, 9, and 10 except for a pad area PA-2, a pad group PDG, and connection lines CL may be equally applied.

The display panel DP-2 may include the display substrate PS, the plurality of pad groups PDG, and the connection lines CL. The display substrate PS may include a display area DA, a non-display area NDA, and a pad area PA-2, and the pad area PA-2 may be disposed on at least one side of the display area DA.

In the display panel DP-2, each of the first pads PD1 and the second pads PD2 may have a rectangular shape on the plane. That is, each of the first pads PD1 of the first pad group G1 and the second pads PD2 of the second pad groups G2-R and G2-L may have a rectangular shape on the plane defined by the first directional axis DR1 and the second directional axis DR2.

Each of the first pads PD1 of the first pad group G1 may have a rectangular shape having a first length L1 and a first width W1, and each of the second pads PD2 of the second pad groups G2-R and G2-L may have a rectangular shape having a second length L2 different from the first length L1 and a second width W2 different from the first width W1.

In an exemplary embodiment, the plurality of pad groups PDG may include the first pad group G1 disposed at a central portion of the pad area PA-2 and the second pad groups G2-R and G2-L disposed on at least one side of the first pad group G1. The inclination of each of the second pads PD2 of the second pad groups G2-R and G2-L may be greater than that of each of the first pads PD1 of the first pad group G1. Also, the pitch between the second pads PD2 may be less than that between the first pads PD1.

The plurality of first sub pad groups G2-R may be arranged outwardly from the central portion of the pad area PA-2. The inclinations and the pitch of the second pads PD2 of the first sub pad groups G2-R may be different from each other. Also, the lengths and the widths of the second pads PD2 of the first sub pad groups G2-R may be different from each other. Also, the second pads PD2 of the same first sub pad group G2-R may have substantially the same length and width.

The inclinations of the second pads PD2 of the first sub pad groups G2-R may gradually increase outwardly from the central portion of the pad area PA-2, and the pitch between the second pads PD2 of the first sub pad groups G2-R may gradually decrease outwardly form the central portion of the pad area PA-2. Also, the lengths of the second pads PD2 of the first sub pad groups G2-R may gradually increase outward from the central portion of the pad area PA-2, and the widths of the second pads PD2 of the first sub pad groups G2-R may gradually decrease outward form the central portion of the pad area PA-2.

The plurality of second sub pad groups G2-L may be disposed to be arranged outwardly from the central portion of the pad area PA-2. The inclinations and the pitch of the second pads PD2 of the second sub pad groups G2-L may be different from each other. Also, the lengths and the widths of the second pads PD2 of the second sub pad groups G2-L may be different from each other. Also, the second pads PD2 of the same second sub pad group G2-L may have substantially the same length and width.

The inclinations of the second pads PD2 of the second sub pad groups G2-L may gradually increase outward from the central portion of the pad area PA-2, and the pitch between the second pads PD2 of the second sub pad groups G2-L may gradually decrease outward form the central portion of the pad area PA-2. Also, the lengths of the second pads PD2 of the second sub pad groups G2-L may gradually increase outward from the central portion of the pad area PA-2, and the widths of the second pads PD2 of the second sub pad groups G2-L may gradually decrease outward form the central portion of the pad area PA-2.

The first pads PD1 of the first pad group G1 and the second pads PD2 of the second pad group G2-R and G2-L may have substantially the same surface area. That is, the first pad PD1 and the second pad PD2 may have different lengths and widths and substantially the same surface area.

In the display panel DP-2 of FIGS. 13 and 14, a first virtual reference line IL1 connecting ends of one side of the pads PD1 and PD2, which are adjacent to the display area DA, each other and a second virtual reference line IL2 connecting ends of the other side of the pads PD1 and PD2, which are adjacent to an edge ED of the display substrate PS, may be generally parallel to each other. That is, the first virtual line IL1 and the second virtual line IL2 may be generally parallel to the edge ED of the display substrate PS.

The first virtual line IL1 may be a line connecting uppermost ends of the first pad PD1 and the second pad PD2 to each other on the plane, and the second virtual line IL2 may be a line connecting lowermost ends of the first pad PD1 and the second pad PD2 to each other on the plane. Referring to FIG. 14, a distance d between the first virtual line IL1 and the second virtual line IL2 may be a vertical length of each of the pads PD1 and PD2. That is, in an exemplary embodiment illustrated in FIGS. 13 and 14, the vertical length of the pads PD1 and PD2 of the plurality of pad groups PDG may be substantially the same.

Figure 15:
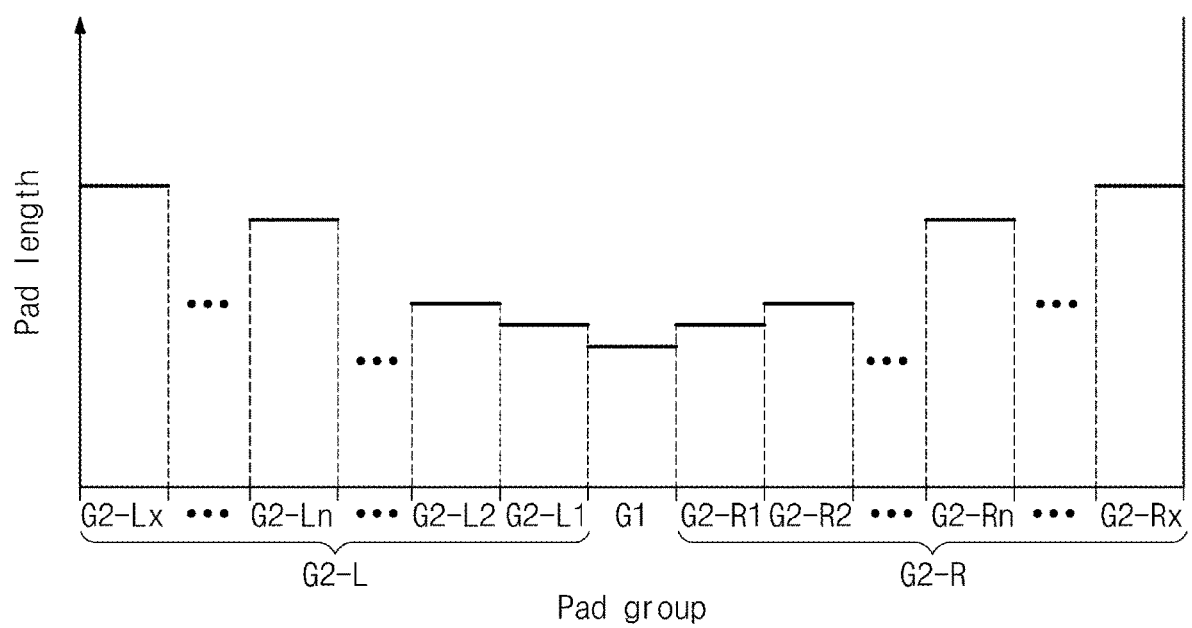
FIG. 15 is a graph illustrating a length of the pad depending on the pad group according to an exemplary embodiment of the invention.
Figure 16:
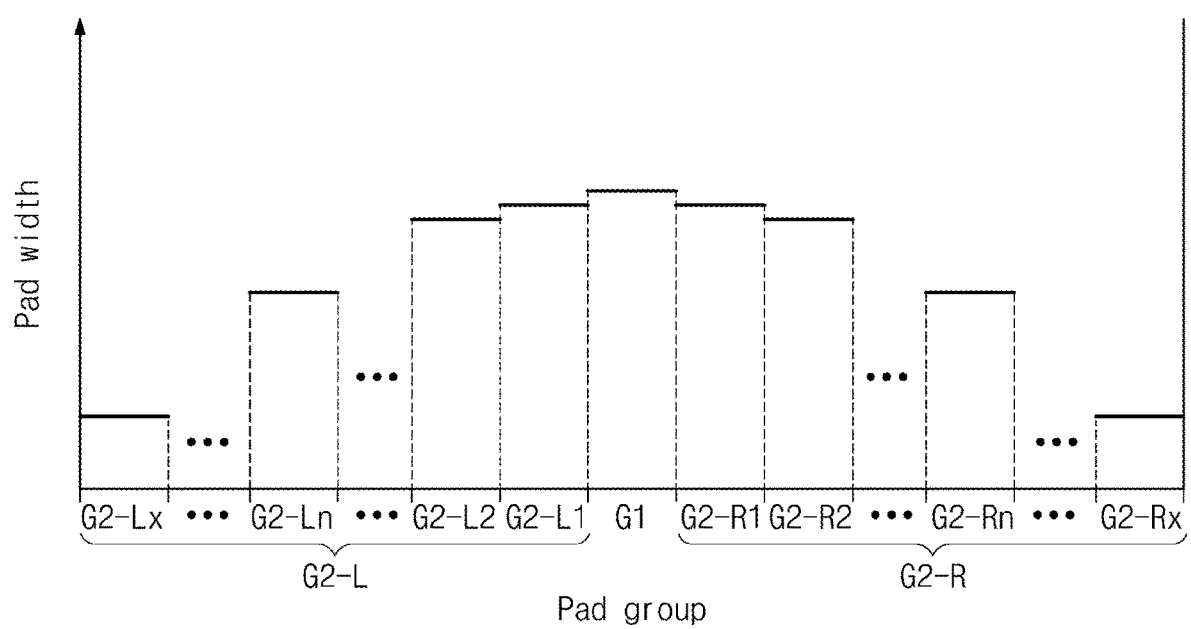
FIG. 16 is a graph illustrating a width of the pad depending on the pad group according to an exemplary embodiment of the invention.

FIGS. 15 and 16 are graphs illustrating a pad length and a pad width, respectively, for each pad group in the display panel DP-2. FIG. 15 is a graph illustrating a pad length for each pad group in the first pad groups G1 and the second pad groups G2-R and G2-L in the display panel DP-2, and FIG. 16 is a graph illustrating a pad width for each pad group in the first pad groups G1 and the second pad groups G2-R and G2-L in the display panel DP-2.

Referring to FIG. 15, in the display panel DP-2, each of the pads of the first pad groups G1 may have the shortest length, and the pads of the first sub pad groups G2-R disposed on one side of the first pad group G1 may have lengths that gradually increase as spaced apart from the first pad group G1. Also, the pads of the second sub pad groups G2-L disposed on the other side of the first pad group G1 may have lengths that gradually increase as spaced apart from the first pad group G1. The first sub pad groups G2-R and the second sub pad groups G2-L, which are arranged generally symmetrical to each other with respect to the first pad group G1, may have substantially the same length.

Referring to FIG. 16, in the display panel DP-2, each of the pads of the first pad groups G1 of the plurality of pads disposed on the pad area PA-2 may have the longest length, and the pads of the first sub pad groups G2-R disposed on one side of the first pad group G1 may have lengths that gradually decrease as spaced apart from the first pad group G1. Also, the pads of the second sub pad groups G2-L disposed on the other side of the first pad group G1 may have widths that gradually decrease as spaced apart from the first pad group G1. The first sub pad groups G2-R and the second sub pad groups G2-L, which are arranged generally symmetrical to each other with respect to the first pad group G1, may have substantially the same width.

That is, referring to FIGS. 13, 14, 15, and 16, the display panel DP-2 may include the plurality of pad groups PDG arranged in the first direction DR1, and the pads of the different pad groups may have different lengths and widths. The plurality of pads of one pad group may have substantially the same length and width. That is, the display panel DP-2 may include pads having different lengths and different widths for each group and having substantially the same surface area to facilitate adhering to a connection member (see reference symbol AF of FIG. 17) that will be described later and provide similar resistance values of the pads, thereby realizing good reliability and electrical properties.

Also, in the display panel DP-2, the pads of the different pad groups may have different inclinations and different pitches. The inclinations and the pitches of the plurality of pads of one pad group may be substantially the same. That is, since a different inclination value for each pad group and a different pitch for each pad group are provided, the plurality of pad groups PDG may be arranged while minimizing the dead space on the pad area PA-2.

Figure 17:
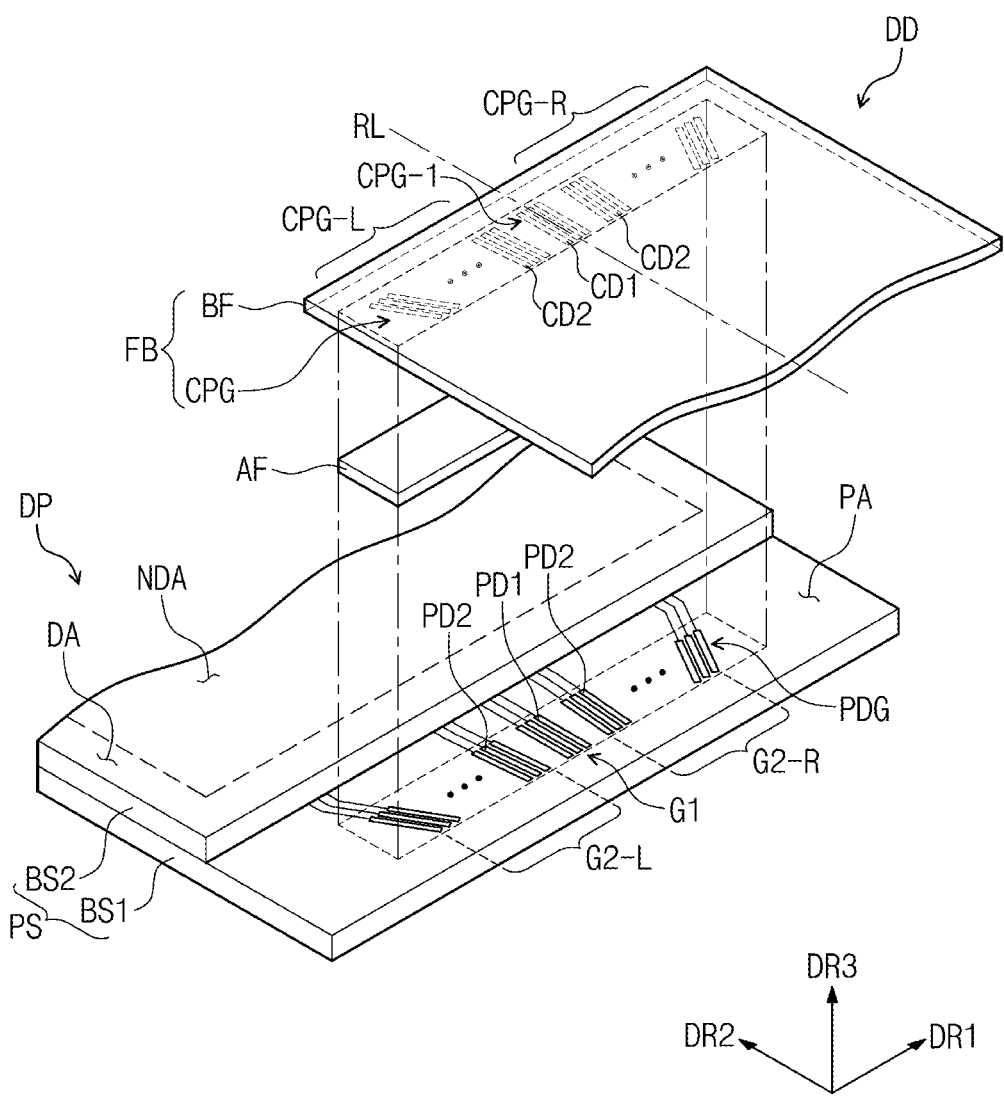
FIG. 17 is an exploded perspective view of a potion of a display device constructed according to an exemplary embodiment of the invention.

In an exemplary embodiment, a display device including the display panel according to the foregoing embodiment will be described. FIG. 17 is an exploded perspective view of a portion of the display device construed according to an exemplary embodiment. The exploded perspective view of the display device of FIG. 17 may relate to the display device of FIG. 1. Referring to FIG. 17, a display device DD may include a display panel DP and a connection circuit board FB.

The display panel DP may include a display area DA and a pad area PA. The display area DA may be an area on which an image is displayed and include a plurality of pixels. The pad area PA may be disposed on at least one side of the display area DA. Although the pad area PA is disposed on only one side of the display area DA in FIGS. 1 and 17, the exemplary embodiments are not limited thereto. For example, the pad area PA may be additionally disposed outside the display area DA.

The display panel DP may include a plurality of pad groups PDG. The pad groups PDG may be disposed on the pad area PA and arranged in the first direction DR1. The pad groups PDG may include a first pad group G1 having a first inclination with reference to a reference line RL and including a plurality of first pads PD1, which are spaced a first distance from each other, second pad groups G2-R and G2-L having a second inclination with respect to the reference line RL and including a plurality of second pads PD2, which are spaced a second distance from each other.

The same contents as those described with reference to FIGS. 1, 2, 3, 4, 5, 6, 7A, 7B, 7C, 8, 9, 10, 11, 12, 13, 14, 15, and 16 may be applied to the display panel DP and the pad groups PDG of the display panel DP. That is, the display device DD may include the display panels DP, DP-1, and DP-2 according to the foregoing embodiments.

The display device DD may include the connection circuit board FB, and the connection circuit board FB may include a plurality of connection pad groups CPG. The connection circuit board FB may include a flexible board BF and the plurality of connection pad groups CPG disposed on the flexible substrate BF.

The flexible board BF may be made of a flexible material, for example, polyimide. The flexible board BF may be provided in the form of a film. Connection pads CD1 and CD2 of the connection pad groups CPG disposed on the flexible board BF may be output pads or input pads.

The connection pad groups CPG may include a first connection pad group CPG1 disposed to correspond to the first pad group G1 of the display panel DP and second connection pad groups CPG-R and CPG-L disposed to correspond to the second pad groups G2-R and G2-L of the display panel DP.

The connection pad groups CPG may be arranged in the first direction DR1. The connection pad groups CPG may be disposed to correspond to the pad groups PDG. The connection pad groups CPG may include a first pad group CPG1 having a first inclination with reference to a reference line RL and including a plurality of first connection pads CD1, which are spaced a first distance from each other, second pad groups CPG-R and CPG-L having a second inclination with respect to the reference line RL and including a plurality of second connection pads PD2, which are spaced a second distance from each other. The inclination of each of the pads CD1 and CD2 may represent an angle between an extension direction of the reference line RL and an extension direction of the first or second connection pads CD1 and CD2. In this specification, the inclination value may be a positive value and be an acute angle. The first connection pad CD1 may face the corresponding first pad PD1, and the second connection pad CD2 may face the corresponding second pad PD2.

In an exemplary embodiment, the plurality of connection pad groups CPG may include the first pad group CPG1 disposed at a central portion of the flexible board BF and the second connection pad groups CPG-R and CPG-L disposed on at least one side of the first connection pad group CPG1. An inclination of each of the second connection pads CD2 of the second connection pad groups CPG-R and CPG-L may be greater than that of each of the first connection pads CD1 of the first connection pad group CPG1. Also, the pitch between the second connection pads CD2 may be less than that between the first connection pads CD1.

The second connection pad groups CPG-R and CPG-L may include a first sub connection pad groups CPG-R disposed on one side of the first connection pad group CPG1 and a second sub connection pad group CPG-L disposed on the other side of the first connection pad group CPG1. For example, in the display device DD, the first sub connection pad groups CPG-R may be disposed to correspond to the first sub pad groups G2-R, and the second sub connection pad groups CPG-L may be disposed to correspond to the second sub pad group G2-L.

The inclinations of the first sub connection pads CD2 of the first sub pad connection groups CPG-R may be different from each other. The inclinations of the second connection pads CD2 of the first sub connection pad groups CPG-R may gradually increase outwardly from a central portion of the flexible board BF. The second connection pads CD2 may be disposed to correspond to the second pad PD2.

Also, the inclinations of the second connection pads CD2 of the second sub connection pad groups CPG-L may be different from each other. The inclinations of the second connection pads CD2 of the second sub connection pad groups CPG-L may gradually increase outwardly from the central portion of the flexible board BF. The second connection pads CD2 may be disposed to correspond to the second pad PD2.

The display device DD may further include the connection member AF disposed between the display panel DP and the connection circuit board FB. The connection member AF may electrically connect the pads PD1 and PD2 of the display panel DP to the connection pads CD1 and CD2 of the connection circuit board FB. The connection member AF may have electrical conductivity and adhesion. The connection member AF may include a thermosetting or photocurable material. For example, the connection member AF may include anisotropic conductive film (ACF).

The display device may include the plurality of pad groups. The plurality of pads may be arranged so that the inclinations of the pads of the pad groups gradually increase outwardly from the central portion of the pad area, and the pitch between the pads of the pad groups gradually decrease outwardly from the central portion of the pad area. Thus, the pad area may be reduced in surface area, and the dead space disposed outside the display area may be minimized or reduced to realize the display device having various designs.

The display panel and the display device according to exemplary embodiments may include the plurality of pad groups. The inclinations and the pitches of the pads of the pad groups may be changed to optimize the arrangement of the pads. Thus, when compared to display panels having constant inclination and pitch, even though the same number of pads are provided, the pad area according to the exemplary embodiments of the invention may be have relatively reduced length and dead space. In addition, the display panel and the display device according to the exemplary embodiments, the inclinations and the pitches of the pads may be optimized to maintain the sufficient contact area with the connection member, thereby realizing the good reliability while reducing the dead space.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
a display substrate having a display area to display an image, and a pad area disposed on at least one side of the display area; and
a plurality of pads arranged on the pad area in a first direction, the plurality of pads comprises:
a plurality of first pads, and each of the first pads has an each first inclination with respect to a first reference line that is parallel to a second direction normal to the first direction; and
a plurality of second pads, and each of the second pads has an each second inclination, which is different from the each first inclination, with respect to the first reference line, and
wherein one of a second reference line and a third reference line defined by connection of respective ends of the first pads and the second pads is a curved line and the other one of the second reference line and the third reference line is a straight line or a substantially straight line, and
wherein the second reference line is defined adjacent to the display area, and the third reference line is defined adjacent to an edge of the display substrate,
wherein the plurality of pads arranged in a plurality of pad groups, and the plurality of pad groups comprises:
a first pad group is disposed on a central portion of the pad area; and
a second pad group is disposed on at least one side of the first pad group, and
wherein the first pad group includes the first pads, and the second pad group includes the second pads,
wherein the first pads in the first pad group are spaced from each other at a first pitch,
wherein the second pads in the second pad group are spaced from each other at a second pitch different from the first pitch,
wherein the second pad group comprises:
a plurality of first sub pad groups disposed on one side of the first pad group; and
a plurality of second sub pad groups disposed on the other side of the first pad group, and wherein each of the first sub pad groups and the second sub pad groups comprises the second pads,
wherein the second inclinations of the second pads of the first sub pad groups increase in the first direction outwardly from the central portion toward the end of the pad area, and
wherein the second pitch between the second pads decreases in the first direction outwardly from the central portion toward the end of the pad area.

2. The display panel of claim 1, wherein the plurality of pads arranged in a fan shape.

3. The display panel of claim 1, wherein the second reference line is a curved line convex toward the display area, and
the third reference line is a straight line parallel to the edge of the display substrate.

4. The display panel of claim 1, wherein the second reference line is a substantially straight line extending generally parallel to the edge of the display substrate, and
the third reference line is a curved line convex toward the edge of the display substrate.

5. The display panel of claim 1, wherein the each second inclination is greater than the each first inclination.

6. The display panel of claim 1, wherein a maximum of the second pitch is less than a minimum of the first pitch.

7. The display panel of claim 1, wherein the second pads of an n-th first sub pad group from the first pad group in one direction and the second pads of an n-th second sub pad group from the first pad group in the other direction are disposed generally symmetrical to each other with respect to the first pad group, where the n is an integer equal to or greater than 1.

8. A display panel comprising:
a display substrate having a display area to display an image, and a pad area disposed on at least one side of the display area; and
a plurality of pads arranged on the pad area in a first direction, the plurality of pads comprises:
a plurality of first pads, and each of the first pads has an each first inclination with respect to a first reference line that is parallel to a second direction normal to the first direction; and
a plurality of second pads, and each of the second pads has an each second inclination, which is different from the each first inclination, with respect to the first reference line, and
wherein one of a second reference line and a third reference line defined by connection of respective ends of the first pads and the second pads is a curved line and the other one of the second reference line and the third reference line is a straight line or a substantially straight line, and
wherein the second reference line is defined adjacent to the display area, and the third reference line is defined adjacent to an edge of the display substrate,
wherein the plurality of pads arranged in a plurality of pad groups, and the plurality of pad groups comprises:
a first pad group is disposed on a central portion of the pad area; and
a second pad group is disposed on at least one side of the first pad group, and
wherein the first pad group includes the first pads, and the second pad group includes the second pads,
wherein the first pads in the first pad group are spaced from each other at a first pitch,
wherein the second pads in the second pad group are spaced from each other at a second pitch different from the first pitch,
wherein the second pad group comprises:
a plurality of first sub pad groups disposed on one side of the first pad group; and
a plurality of second sub pad groups disposed on the other side of the first pad group, and wherein each of the first sub pad groups and the second sub pad groups comprises the second pads,
wherein each of the first sub pad groups and the second sub pad groups comprises the second pads, and
wherein the second inclinations of the second pads of the second sub pad groups increase in the first direction outwardly from the central portion toward the end of the pad area, and wherein the second pitch between the second pads decreases in the first direction outwardly from the central portion to the end of the pad area.

9. A display panel comprising:

a display substrate having a display area to display an image, and a pad area disposed on at least one side of the display area;

a plurality of pads arranged on the pad area in a first direction; and a plurality of lines disposed between the display area and the pad area, wherein the plurality of pads comprise:

a plurality of first pads, each of the first pads has an each first inclination with respect to a first reference line that is parallel to a second direction normal to the first direction; and a plurality of second pads, each of the second pads has an each second inclination with respect to the first reference line different from the each first inclination, and wherein of a second reference line and a third reference line defined by connection of respective ends of the first pads and the second pads is a curved line and the other one of the second reference line and the third reference line is a straight line or a substantially straight line, and wherein the second reference line is defined adjacent to the display area, and the third reference line is defined adjacent to an edge of the display substrate, wherein the plurality of pads arranged in a plurality of pad groups, and the plurality of pad groups comprises:

a first pad group is disposed on a central portion of the pad area; and a second pad group is disposed on at least one side of the first pad group, and wherein the first pad group includes the first pads, and the second pad group includes the second pads, and wherein the first pads in the first pad group are spaced from each other at a first pitch, and the second pads in the second pad group are spaced from each other at a second pitch different from the first pitch, wherein the second pad group comprises:

a plurality of first sub pad groups disposed on one side of the first pad group; and a plurality of second sub pad groups disposed on the other side of the first pad group, and wherein each of the first sub pad groups and the second sub pad groups comprises the second pads, wherein the second inclinations of the second pads of the first sub pad groups increase in the first direction outwardly from the central portion toward the end of the pad area, and wherein the second pitch between the second pads decreases in the first direction outwardly from the central portion toward the end of the pad area.

10. The display panel of claim 9, wherein a maximum of the second pitch is less than a minimum of the first pitch.

11. The display panel of claim 9, wherein the each second inclination is greater than the each first inclination.

12. The display panel of claim 9, wherein the lines comprise:

a first line including:

a first sub line part extending from the display area toward the pad area; and a second sub line part extending from the first sub line part and connected to the first pads; and a second line including:

a third sub line part extending from the display area toward the pad area; and a fourth sub line part extending from the third sub line part and connected to the second pads, wherein the second sub line part has a third inclination with respect to the first reference line, and the fourth sub line part has a fourth inclination with respect to the first reference line different from the third inclination.

13. The display panel of claim 12, wherein the first inclination and the third inclination are substantially the same, and the second inclination and the fourth inclination are substantially the same.

14. A display device comprising:

a display panel having a display area and a pad area disposed on at least one side of the display area, the pad area including a plurality of pads arranged in a first direction; and a circuit board including a plurality of connection pads coupleable to the pads, wherein the plurality of pads comprise:

a plurality of first pads, each of the first pads has an each first inclination with respect to a first reference line that is parallel to a second direction normal to the first direction; and a plurality of second pads, each of the second pads has an each second inclination, which is different from the each first inclination, with respect to the first reference line, and wherein one of a second reference line and a third reference line defined by connection of respective ends of the first pads and the second pads is a curved line and the other one of the second reference line and the third reference line is a straight line or a substantially straight line, and wherein the second reference line is defined adjacent to the display area, and the third reference line is defined adjacent to an edge of the display substrate, wherein the plurality of pads arranged in a plurality of pad groups, and the plurality of pad groups comprises:

a first pad group is disposed on a central portion of the pad area; and a second pad group is disposed on at least one side of the first pad group, and wherein the first pad group includes the first pads, and the second pad group includes the second pads, and wherein the first pads in the first pad group are spaced from each other at a first pitch, and the second pads in the second pad group are spaced from each other at a second pitch different from the first pitch, wherein the second pad group comprises:

a plurality of first sub pad groups disposed on one side of the first pad group; and a plurality of second sub pad groups disposed on the other side of the first pad group, and wherein each of the first sub pad groups and the second sub pad groups comprises the second pads, wherein the second inclinations of the second pads of the first sub pad groups increase in the first direction outwardly from the central portion toward the end of the pad area, and wherein the second pitch between the second pads decreases in the first direction outwardly from the central portion toward the end of the pad area.

15. The display device of claim 14, wherein the second inclination is greater than the first inclination.

\* \* \* \* \*